(12) United States Patent
Muto

(10) Patent No.: US 9,766,284 B2
(45) Date of Patent: Sep. 19, 2017

(54) SENSOR FAULT DETECTION CIRCUIT, RELATIVE ANGLE DETECTION DEVICE, AND MOTOR-DRIVEN POWER STEERING APPARATUS

(71) Applicant: Showa Corporation, Gyoda-shi (JP)

(72) Inventor: Hiroyuki Muto, Haga-gun (JP)

(73) Assignee: SHOWA CORPORATION, Gyoda-Shi (JP)

(*) Notice: Subject to any disclaimer, the term of this patent is extended or adjusted under 35 U.S.C. 154(b) by 31 days.

(21) Appl. No.: 15/007,462

(22) Filed: Jan. 27, 2016

(65) Prior Publication Data
US 2016/0252568 A1 Sep. 1, 2016

(30) Foreign Application Priority Data

Feb. 26, 2015 (JP) .................. 2015-037193

(51) Int. Cl.
G01D 5/14 (2006.01)
G01R 31/28 (2006.01)
B62D 5/04 (2006.01)
G01R 31/02 (2006.01)
G01D 3/08 (2006.01)

(52) U.S. Cl.
CPC ......... *G01R 31/2829* (2013.01); *B62D 5/046* (2013.01); *G01D 3/08* (2013.01); *G01R 31/025* (2013.01)

(58) Field of Classification Search
CPC ...... G01R 31/282; G01R 31/025; G01R 7/00; B62D 5/046; G01D 5/14
USPC ......... 318/400.37, 400.38, 400.39, 450, 457, 318/461–463, 490
See application file for complete search history.

(56) References Cited

U.S. PATENT DOCUMENTS

| 4,264,896 A * | 4/1981 | Sakarya | G08C 23/04 323/299 |
| 9,581,633 B2 * | 2/2017 | Muto | B62D 6/10 |

(Continued)

FOREIGN PATENT DOCUMENTS

| JP | 2009-255645 A | 11/2009 |
| JP | 2013-213677 A | 10/2013 |
| WO | WO-2013/145400 A | 10/2013 |

OTHER PUBLICATIONS

Office Action mailed Jun. 29, 2016 for the corresponding U.K. Patent Application No. GB1601552.1.

*Primary Examiner* — Bentsu Ro
(74) *Attorney, Agent, or Firm* — Leason Ellis LLP

(57) ABSTRACT

A sensor fault detection circuit includes: a first amplifier circuit that includes a first pair of elements operating reversely to each other, and amplifies a first sensor signal input from a first voltage amplifier; a second amplifier circuit that includes a second pair of elements operating reversely to each other, and amplifies a second sensor signal input from the second voltage amplifier; and a fault diagnosis unit that detects abnormality of a first voltage signal or a second voltage signal based on the first voltage signal output from the first amplifier circuit and the second voltage signal output from the second amplifier circuit. Characteristics of the first pair of elements are asymmetrical to each other, and characteristics of the second pair of elements are asymmetrical to each other in a same relationship with a relationship of the asymmetry between the characteristics of the first pair of elements.

11 Claims, 16 Drawing Sheets

(56) References Cited

U.S. PATENT DOCUMENTS

2003/0040872 A1* 2/2003 Ueno .................... B62D 5/049
 702/41
2015/0015270 A1 1/2015 Muto

* cited by examiner

SENSOR FAULT DETECTION CIRCUIT, RELATIVE ANGLE DETECTION DEVICE, AND MOTOR-DRIVEN POWER STEERING APPARATUS

CROSS-REFERENCE TO RELATED APPLICATIONS

This application claims the benefit of Japanese Patent Application JP 2015-037193, filed Feb. 26, 2015, the entire content of which is hereby incorporated by reference, the same as if set forth at length.

BACKGROUND OF THE INVENTION

1. Field of the Invention

The present invention relates to a sensor fault detection circuit, a relative angle detection device, and an electric power steering apparatus.

2. Description of Related Art

In the related art, there is proposed a technology in which an electric power steering apparatus includes a torque sensor (relative angle detection device), and an electric motor is controlled based on a detection value from the torque sensor.

For example, a torque sensor disclosed in JP-A-2009-255645 has the following configuration. That is, the torque sensor is configured to include a torsion bar that coaxially connects an input shaft to an output shaft; a ring-shaped magnet attached to an end portion of the input shaft; a pair of magnetic yokes attached to an end portion of the output shaft; a magnetic sensor that detects magnetic flux density occurring in the magnetic yokes; and the like.

A relative angle detection device disclosed in JP-A-2013-213677 has the following configuration. That is, the relative angle detection device includes first output means for outputting a signal which corresponds to a relative rotation angle between two rotation shafts which are coaxially disposed; a first amplifier circuit that is configured as a combination of circuits operating reversely to each other, and amplifies the output signal from the first output means; a second output unit that outputs a signal that corresponds to the relative rotation angle, and has a characteristic which is contradictory to that from the first output means; a second amplifier circuit that is configured as a combination of circuits operating reversely to each other, and amplifies the output signal from the second output unit; a first resistor between the first amplifier circuit and a power supply terminal that receives a power supply voltage, or between the first amplifier circuit and a reference terminal that receives a reference voltage; and a second resistor that is provided between the second amplifier circuit and a power supply terminal that receives a power supply voltage, or between the second amplifier circuit and the reference terminal that receives a reference voltage, and in a portion equivalent to a portion in which the first resistor is provided.

SUMMARY OF THE INVENTION

According to a configuration under consideration, the reliability of a sensor is improved by adopting multiplexing technology using multiple sensors, and a fault of the sensors can be detected by setting different output characteristics and monitoring multiple output voltages. In this case, preferably, it is possible to detect a short-circuit fault occurring between signal lines through which output values of the multiple sensors are transmitted.

An object of the present invention is to provide a sensor fault detection circuit, a relative angle detection device, and a motor-driven power steering apparatus which can detect a short-circuit fault occurring between signal lines through which output values of multiple sensors are transmitted.

According to an aspect of the present invention, there is provided a sensor fault detection circuit including: a first amplifier circuit that includes a first pair of elements operating reversely to each other, and amplifies a first sensor signal input from a fault detection target to output a first signal; a second amplifier circuit that includes a second pair of elements operating reversely to each other, and amplifies a second sensor signal which is input from the fault detection target and is different from the first sensor signal to output a second signal; and an abnormality detection unit that detects abnormality of the first signal or the second signal based on the first signal output from the first amplifier circuit and the second signal output from the second amplifier circuit, in which characteristics of the first pair of elements of the first amplifier circuit are asymmetrical to each other, and characteristics of the second pair of elements of the second amplifier circuit are asymmetrical to each other in a same relationship with a relationship of the asymmetry between the characteristics of the first pair of elements.

Here, the first sensor signal and the second sensor signal obtained from the fault detection target may be different from each other, and the abnormality detection unit may detect abnormality of the fault detection target based on the difference between the first sensor signal and the second sensor signal.

According to another aspect of the present invention, there is provided an relative rotation angle detection device including: a first output unit that outputs a signal which corresponds to a relative rotation angle between two rotation shafts which are coaxially disposed; a first amplifier circuit that includes a first pair of elements operating reversely to each other, and amplifies the output signal from the first output unit to output a first signal; a second output unit that outputs a signal which corresponds to the relative rotation angle and which has a characteristic being contradictory to a characteristic of the signal output from the first output unit; a second amplifier circuit that includes a second pair of elements operating reversely to each other, and amplifies the output signal from the second output unit to output a second signal; and an abnormality detection unit that detects abnormality of the first signal or the second signal based on the first signal output from the first amplifier circuit and the second signal output from the second amplifier circuit, in which characteristics of the first pair of elements of the first amplifier circuit are asymmetrical to each other, and characteristics of the second pair of elements of the second amplifier circuit are asymmetrical to each other in a same relationship with a relationship of the asymmetry between the characteristics of the first pair of elements.

In this case, each of the first amplifier circuit and the second amplifier circuit may be a push-pull circuit.

When a value, obtained by adding a value of the first signal to a value of the second signal, is a value out of a predetermined range, the abnormality detection unit may determine that abnormality of the first signal or the second signal occurs.

Each of the first output unit and the second output unit may have a Hall element configured to output a voltage signal which corresponds to the relative rotation angle between the two rotation shafts, and a voltage amplifier circuit that amplifies the voltage signal output from the Hall element.

According to still another aspect of the present invention, there is provided a motor-driven power steering apparatus including: a first output unit that outputs a signal which corresponds to a relative rotation angle between two rotation shafts which are coaxially disposed; a first amplifier circuit that includes a first pair of elements operating reversely to each other, and amplifies the output signal from the first output unit to output a first signal; a second output unit that outputs a signal which corresponds to the relative rotation angle and which has a characteristic being contradictory to a characteristic of the signal output from the first output unit; a second amplifier circuit that includes a second pair of elements operating reversely to each other, and amplifies the output signal from the second output unit to output a second signal; and an abnormality detection unit that detects abnormality of the first signal or the second signal based on the first signal output from the first amplifier circuit and the second signal output from the second amplifier circuit, in which characteristics of the first pair of elements of the first amplifier circuit are asymmetrical to each other, and characteristics of the second pair of elements of the second amplifier circuit are asymmetrical to each other in a same relationship with a relationship of the asymmetry between the characteristics of the first pair of elements.

According to the present invention, it is possible to provide a sensor fault detection circuit, a relative angle detection device, and a motor-driven power steering apparatus which can detect a short-circuit fault occurring between signal lines through which output values of multiple sensors are transmitted.

BRIEF DESCRIPTION OF THE DRAWINGS

FIG. 8A illustrates the characteristics of the embodiment, and FIG. 8B illustrates the characteristics independent of the embodiment.

FIG. 13A illustrates a flow of current when steering torque is positive, and FIG. 13B illustrates a flow of current when steering torque is negative.

DESCRIPTION OF EMBODIMENTS

Hereinafter, an embodiment of the present invention will be described in detail with reference to the accompanying drawings.

In an example to be described hereinbelow, the torque of a motor-driven power steering apparatus 100 is detected; however, a sensor unit 50 as a fault detection sensor can be applied to other use.

Figure 1:
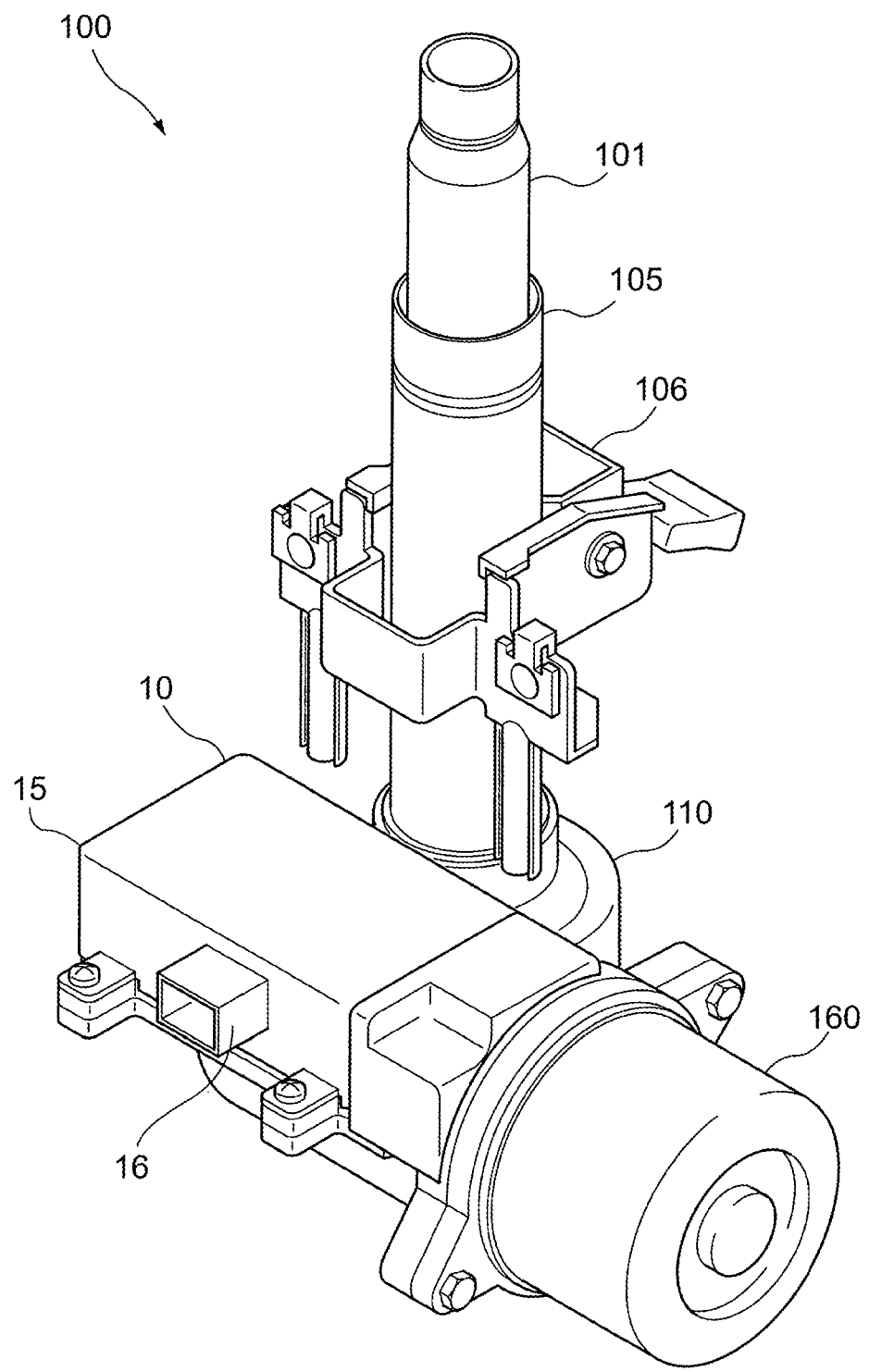
FIG. 1 is a view illustrating the exterior of a motor-driven power steering apparatus according to an embodiment.
Figure 2:
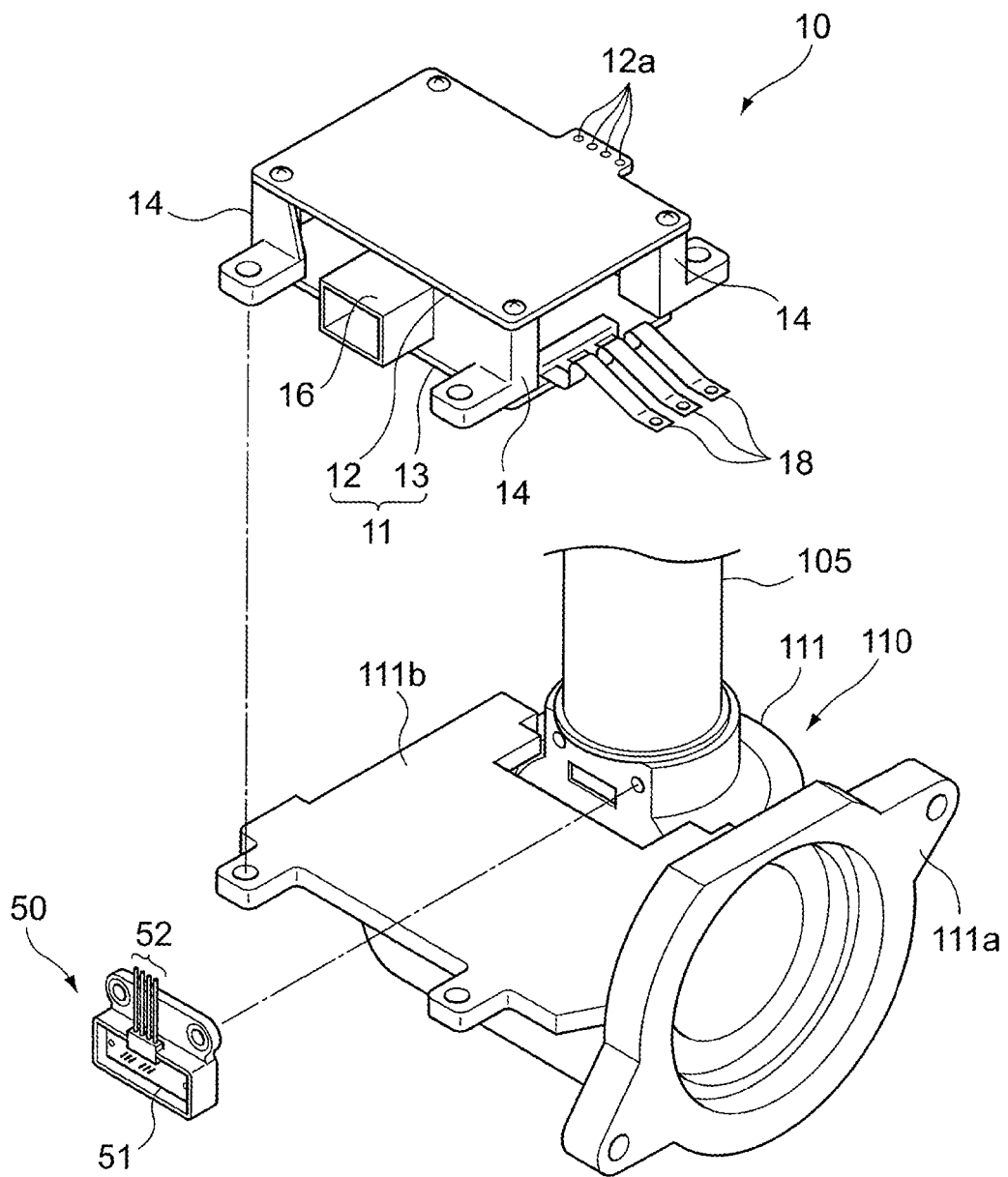
FIG. 2 is a schematic view illustrating the configuration of the motor-driven power steering apparatus.
Figure 3:
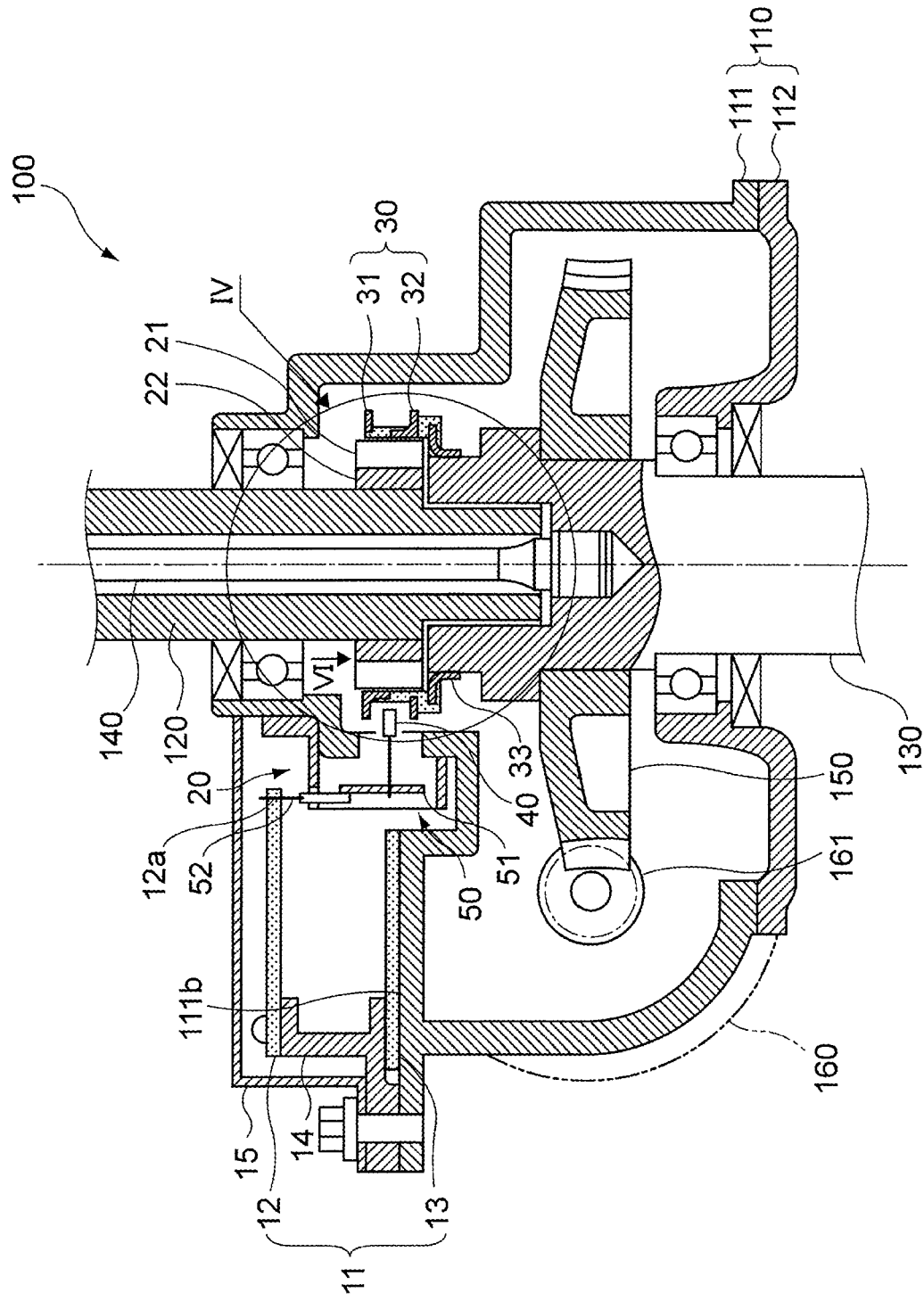
FIG. 3 is a sectional view of the motor-driven power steering apparatus.

FIG. 1 is a view illustrating the exterior of the motor-driven power steering apparatus 100 according to the embodiment. FIG. 2 is a schematic view illustrating the configuration of the motor-driven power steering apparatus 100. FIG. 3 is a sectional view of the motor-driven power steering apparatus 100. In FIG. 2, a cover 15 of an electronic control unit (hereinafter, referred to as an ECU) 10 (to be described later) is not illustrated.

The motor-driven power steering apparatus (hereinafter, referred to as a "steering apparatus") 100 according to the embodiment is a column assist apparatus. The steering apparatus 100 includes a steering shaft 101 connected to a steering wheel (not illustrated), and a steering column 105 that covers the circumference of radial direction of the steering shaft 101.

The steering apparatus 100 includes a gear box 110 that contains a worm wheel 150 and a worm gear 161 (to be described later), and a bracket 106 that directly or indirectly fixes the steering column 105 and the gear box 110 to the main body frame of a conveyance apparatus.

The steering apparatus 100 includes an electric motor 160 that provides an assist force when a driver applies a steering force to the steering wheel; the ECU 10 that controls the operation of an electric motor 160; and a torque detection device 20 that detects steering torque T applied by the driver.

The steering shaft 101 has a first rotation shaft 120, an upper end of which is connected to the steering wheel (not illustrated), and a second rotation shaft 130 which is coaxially connected to the first rotation shaft 120 via a torsion bar 140. The worm wheel 150 is fixed to the second rotation shaft 130 using press fitting or the like. The worm wheel 150 meshes with the worm gear 161 which is connected to an output shaft of the electric motor 160 fixed to the gear box 110.

The gear box 110 has a first member 111 that rotatably supports the first rotation shaft 120, and a second member 112 that rotatably supports the second rotation shaft 130, and is joined to the first member 111 using bolts or the like. The first member 111 has a motor attachment portion 111a which is a portion to which the electric motor 160 is attached, and an ECU attachment portion 111b which is a portion to which the ECU 10 is attached.

In the steering apparatus 100 with the aforementioned configuration, the torque detection device 20 detects the steering torque T based on a relative rotation angle between the first rotation shaft 120 and the second rotation shaft 130, and the ECU 10 controls the driving of the electric motor 160 based on the detected steering torque T such that a rotating drive force is transmitted to the second rotation shaft 130 via the worm gear 161 and the worm wheel 150. Accordingly, torque generated by the electric motor 160 assists the driver who applies a steering force to the steering wheel.

Hereinafter, the torque detection device 20 will be described in detail.

Figure 4:
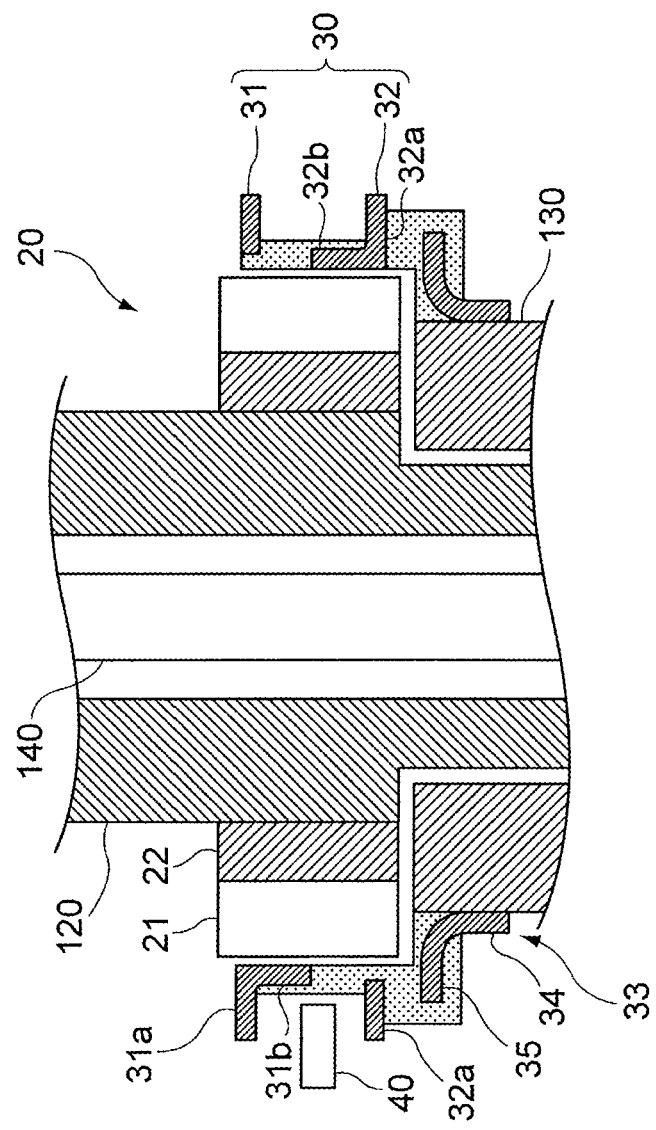
FIG. 4 is an enlarged view illustrating portion IV in FIG. 3.
Figure 5:
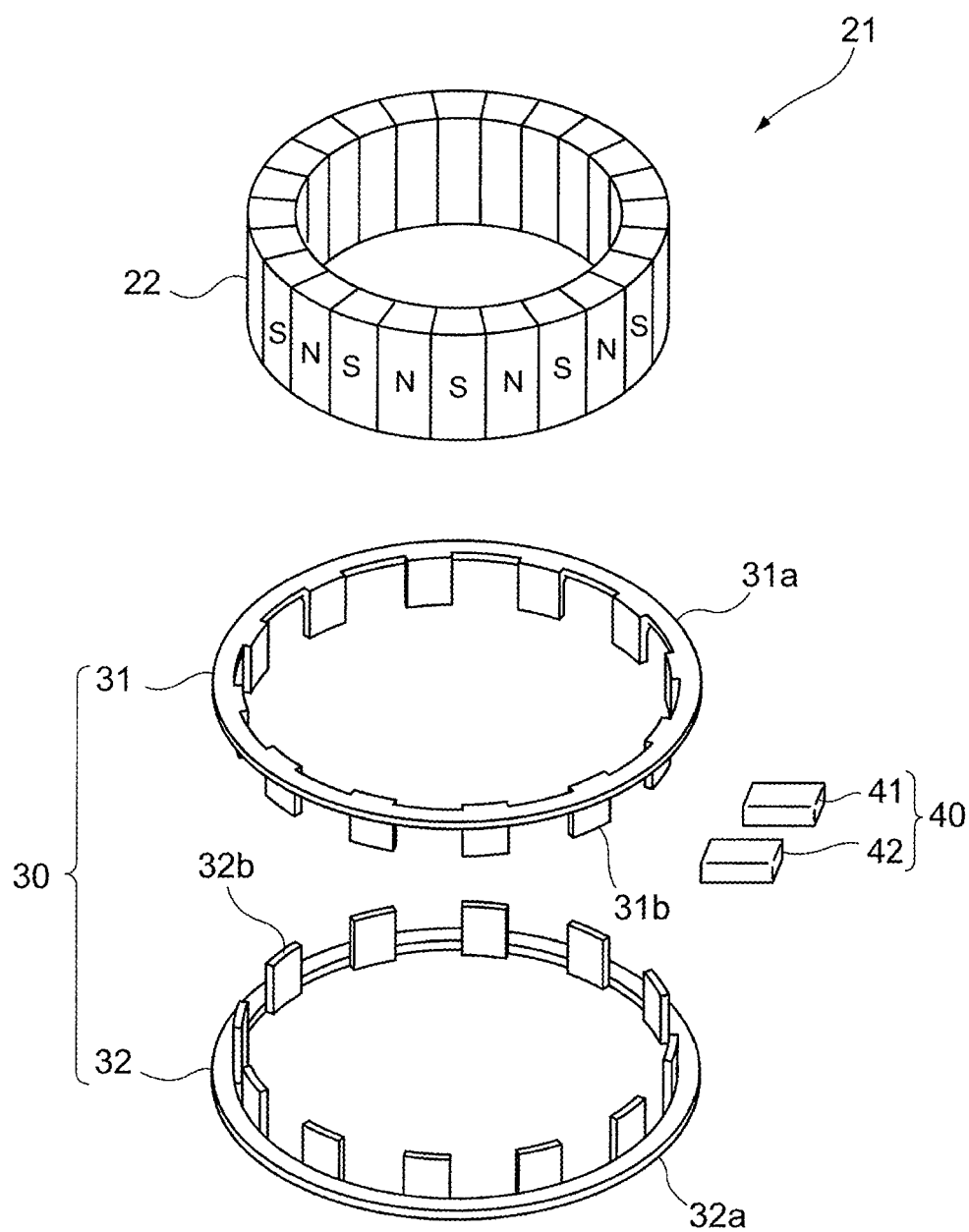
FIG. 5 is a schematic view illustrating the configuration of the main components of a torque detection device according to the embodiment.
Figure 6:
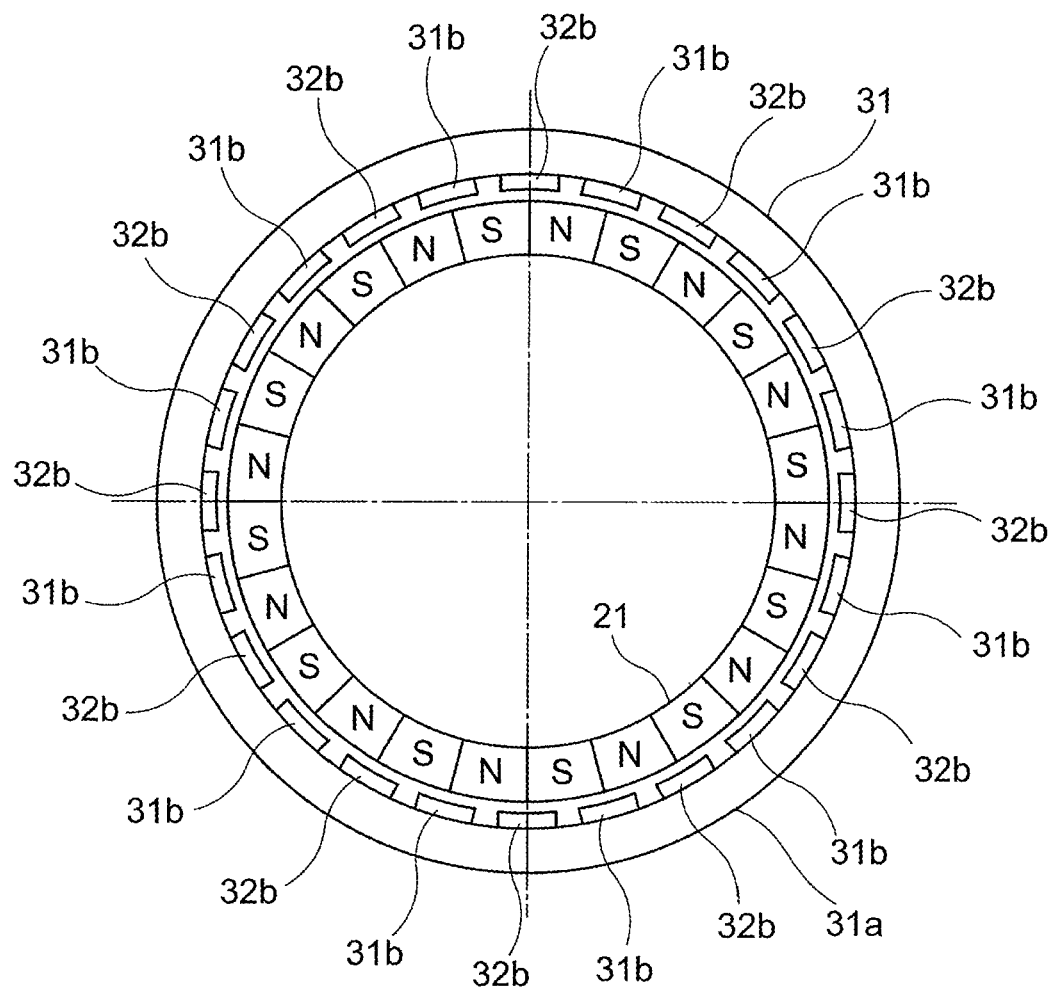
FIG. 6 is a view of a magnet and a yoke (to be described later) of the torque detection device when seen in a direction of arrow VI in FIG. 3.

FIG. 4 is an enlarged view illustrating portion IV in FIG. 3. FIG. 5 is a schematic view illustrating the configuration of the main components of the torque detection device 20 according to the embodiment. FIG. 6 is a view of a magnet 21 and a yoke 30 (to be described later) of the torque detection device 20 when seen in a direction of arrow VI in FIG. 3. In FIG. 6, a yoke holding member 33 (to be described later) is not illustrated.

The torque detection device 20 has the magnet 21 attached to the first rotation shaft 120, and the yoke 30 that is disposed in a magnetic field formed by the magnet 21, and forms a magnetic circuit along with the magnet 21. The torque detection device 20 has a magnet holding member 22 for holding the magnet 21, and a yoke holding member 33 for holding the yoke 30.

The torque detection device 20 has a magnetic sensor 40 that detects the magnetic flux density of the magnetic circuit formed by the magnet 21 and the yoke 30, and the sensor unit 50 that outputs an output signal which corresponds to a relative rotation angle between the first rotation shaft 120 and the second rotation shaft 130 based on an output value from the magnetic sensor 40.

As illustrated in FIG. 5, the magnet 21 has a circular cylindrical shape, and in the magnet 21, N poles and S poles are alternately disposed in an outer circumferential direction of the first rotation shaft 120. The magnet 21 is attached to the first rotation shaft 120 via the magnet holding member 22 with a circular cylindrical shape. That is, the magnet 21 is fixed to the magnet holding member 22, and the magnet holding member 22 is fixed to the first rotation shaft 120. The magnet 21 rotates together with the first rotation shaft 120.

The yoke 30 has a first yoke 31 and a second yoke 32. The first yoke 31 has a first annular portion 31a with a circular plate shape in which a hole, which has a diameter greater than the outer diameter of the magnet 21, is formed in an inside region of the first annular portion 31a, and multiple first protruding portions 31b which extend from the first annular portion 31a in an axial direction of the first rotation shaft 120 (hereinafter, may be simply referred to as an "axial direction").

The second yoke 32 has a second annular portion 32a with a circular plate shape in which a hole, which has a diameter greater than the outer diameter of the magnet 21, is formed in an inside region of the second annular portion 32a, and multiple second protruding portions 32b which extend from the second annular portion 32a in the axial direction.

The first protruding portions 31b of the first yoke 31, and the second protruding portions 32b of the second yoke 32 are formed with the same number of N poles and S poles of the magnet 21. That is, for example, when the magnet 21 has twelve N poles and twelve S poles, twelve first protruding portions 31b are formed, and twelve second protruding portions 32b are formed. As illustrated in FIGS. 4 and 6, the first protruding portions 31b and the second protruding portions 32b are disposed slightly outside of the outer circumferential surface of the magnet 21 in a radial direction of the first rotation shaft 120 in such a way as to face the outer circumferential surface of the magnet 21. Each of the surfaces, which face the magnet 21, of the first protruding portions 31b and the second protruding portions 32b has a rectangular shape when seen in a direction perpendicular to the axis of rotation of the first rotation shaft 120. The first protruding portions 31b and the second protruding portions 32b are alternately disposed in the circumferential direction of the first rotation shaft 120.

In the torque detection device 20 according to the embodiment, when the steering torque T is not applied to the torsion bar 140, that is, when the torsion bar 140 is in a neutral state in which the torsion bar 140 is not twisted, as illustrated in FIG. 6, the boundary line between the N pole and the S pole of the magnet 21 is disposed so as to align with the circumferential center of the first protruding portion 31b of the first yoke 31 in the circumferential direction of the first rotation shaft 120, that is, when seen in a clockwise direction.

When the steering torque T is in the neutral state, as illustrated in FIG. 6, the boundary line between the N pole and the S pole of the magnet 21 is disposed so as to align with the circumferential center of the second protruding portion 32b of the second yoke 32 in the circumferential direction of the first rotation shaft 120, that is, when seen in the clockwise direction. When the steering torque T is applied to the torsion bar 140 such that the torsion bar 140 is twisted, and the first protruding portion 31b faces the N pole or the S pole of the magnet 21, the second protruding portion 32b faces a magnetic pole with a polarity different from that of the magnetic pole that the first protruding portion 31b faces.

The yoke holding member 33 has a circular cylindrical axial portion 34 with a thin wall which extends in an axial direction of the second rotation shaft 130, and a circular plate-like radial portion 35 which extends from the circular cylindrical axial portion 34 in a radial direction of the second rotation shaft 130. The axial portion 34 of the yoke holding member 33 is press-fitted, welded, caulked, or screwed to the second rotation shaft 130 such that the axial portion 34 is fixed to the second rotation shaft 130. Accordingly, the yoke 30 is fixed to the second rotation shaft 130.

Figure 7:
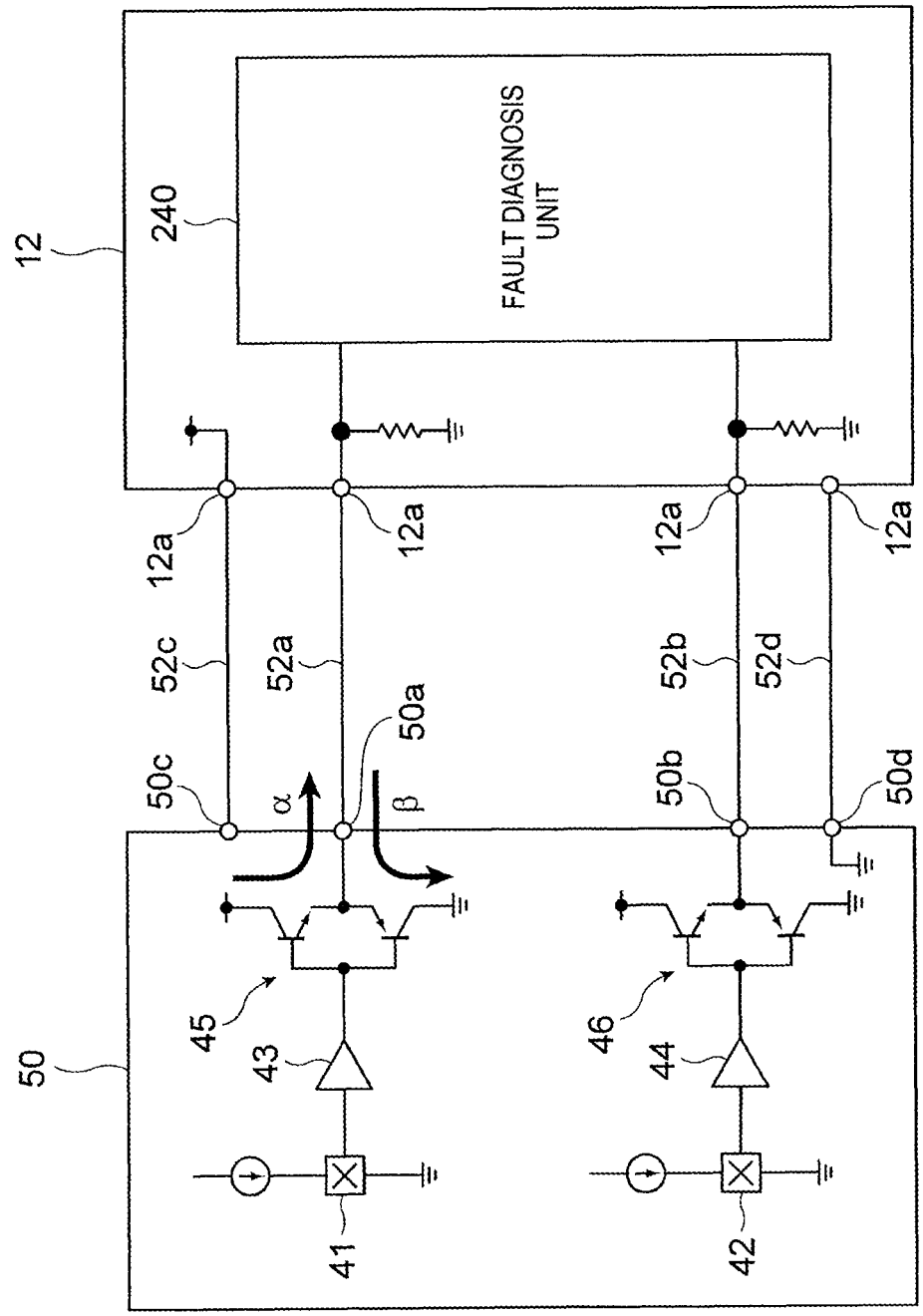
FIG. 7 is a circuit diagram of a sensor unit.

FIG. 7 is a circuit diagram of the sensor unit 50.

The magnetic sensor 40 of the sensor unit 50 has two sensors, that is, a first magnetic sensor 41 and a second magnetic sensor 42 which are disposed between the first annular portion 31a of the first yoke 31 and the second annular portion 32a of the second yoke 32, detect magnetic flux density between the first yoke 31 and the second yoke 32, converts the detected magnetic flux density into a voltage signal, and outputs the voltage signal. A Hall element or a magnetoresistive element can be exemplified as the magnetic sensor 40. The first magnetic sensor 41 and the second magnetic sensor 42 output voltage signals with the same values.

The sensor unit 50 has a first voltage amplifier 43 that amplifies an output voltage from the first magnetic sensor

41; a second voltage amplifier 44 that amplifies an output voltage from the second magnetic sensor 42; a first amplifier circuit 45 that amplifies an output voltage from the first voltage amplifier 43; and a second amplifier circuit 46 that amplifies an output voltage from the second voltage amplifier 44.

The output voltage from the first magnetic sensor 43 is an example of a first sensor signal, and the output voltage from the second magnetic sensor 44 is an example of a second sensor signal. A fault sensor circuit includes the first amplifier circuit 45; a second amplifier circuit 46; and a fault diagnosis unit 240.

The sensor unit 50 has a substrate 51 (refer to FIG. 3) on which the magnetic sensor 40, the first voltage amplifier 43, the second voltage amplifier 44, the first amplifier circuit 45, and the second amplifier circuit 46 are mounted. First ends of four signal lines 52 are connected to the substrate 51, and connect the sensor unit 50 to the ECU 10. Second ends of the four signal lines 52 are connected to a control substrate 12 (to be described later) of the ECU 10. An output signal is transmitted from the first amplifier circuit 45 to the ECU 10 via a signal line 52a of the four signal lines, with the signal line 52a connected to a connection terminal 50a that is provided on the substrate 51, and an output signal is transmitted from the second amplifier circuit 46 to the ECU 10 via a signal line 52b of the four signal lines, with the signal line 52b being connected to a connection terminal 50b that is provided on the substrate 51. A power supply voltage (which may be referred to as H) is supplied to a power supply terminal 50c of the sensor unit 50 via a signal line 52c of the four signal lines, and a GND voltage (which may be referred to as L) is supplied to a GND terminal 50d of the sensor unit 50 via another signal line 52d.

Hereinafter, the first amplifier circuit 45 and the second amplifier circuit 46 will be described. A push-pull circuit can be exemplified as each of the first amplifier circuit 45 and the second amplifier circuit 46 is an integral circuit that is configured as a combination of circuits operating reversely to each other.

The first amplifier circuit 45 is configured as a push-pull circuit in which a high-side transistor (for example, npn bipolar transistor) is connected in series with a low-side transistor (for example, pnp bipolar transistor). That is, in FIG. 7, the high-side transistor (npn bipolar transistor) is illustrated on the upper side, and the low-side transistor (pnp bipolar transistor) is illustrated on the lower side. Here, the high-side transistor (for example, npn bipolar transistor) and the low-side transistor (for example, pnp bipolar transistor) may be illustrated as a pair of elements.

In the following description, the high-side transistor and the low-side transistor are respectively referred as the npn bipolar transistor and the pnp bipolar transistor.

An emitter of the npn bipolar transistor and an emitter of the pnp bipolar transistor are connected to each other, and are connected to the connection terminal 50a.

A base of each of the npn bipolar transistor and the pnp bipolar transistor is connected to an output terminal of the first voltage amplifier 43.

A collector of the npn bipolar transistor is connected to the power supply terminal 50c, and a power supply voltage is applied to this collector. A collector of the pnp bipolar transistor is connected to the GND terminal 50d, and a GND voltage is applied to this collector.

Source current refers to current α which flows from the collector of the npn bipolar transistor to the connection terminal 50a (the signal line 52a) via the emitter, and sink current refers to current β which enters the emitter of the pnp bipolar transistor from the connection terminal 50a (the signal line 52a), and flows to the GND terminal 50d via the collector.

Similar to the first amplifier circuit 45, the second amplifier circuit 46 is configured as a push-pull circuit in which a high-side transistor (for example, npn bipolar transistor) is connected in series with a low-side transistor (for example, pnp bipolar transistor). Accordingly, a detailed description thereof will be omitted. An emitter of the npn bipolar transistor and an emitter of the pnp bipolar transistor are connected to each other, and are connected to the connection terminal 50b.

Hereinafter, characteristics of the high-side transistor (npn bipolar transistor) and the low-side transistor (pnp bipolar transistor) used in each of the first amplifier circuit 45 and the second amplifier circuit 46 will be described.

Figure 8A:
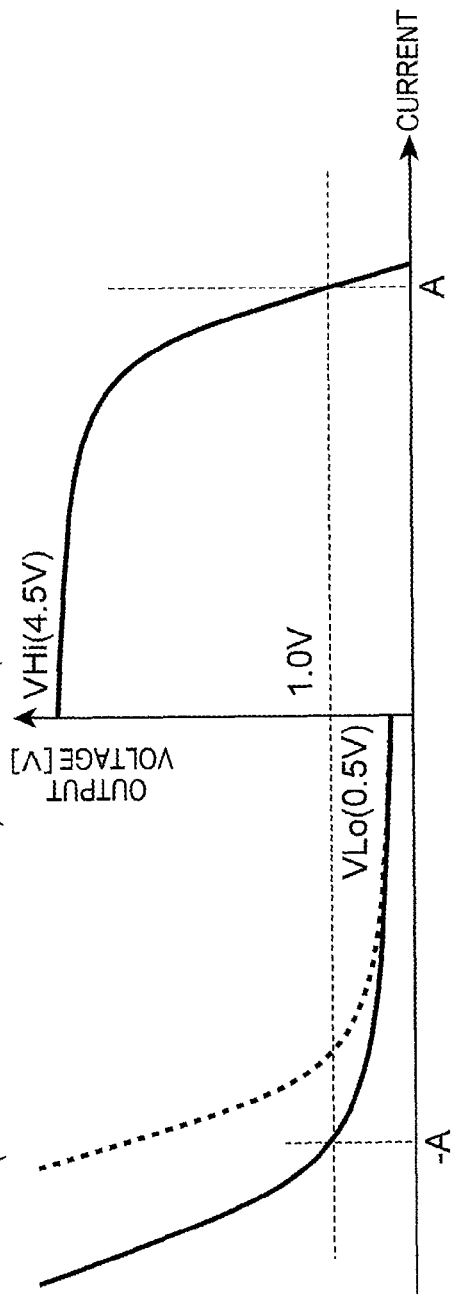
FIGS. 8A and 8B are graphs illustrating characteristics of a high-side transistor (npn bipolar transistor) and a low-side transistor (pnp bipolar transistor).
Figure 8B:
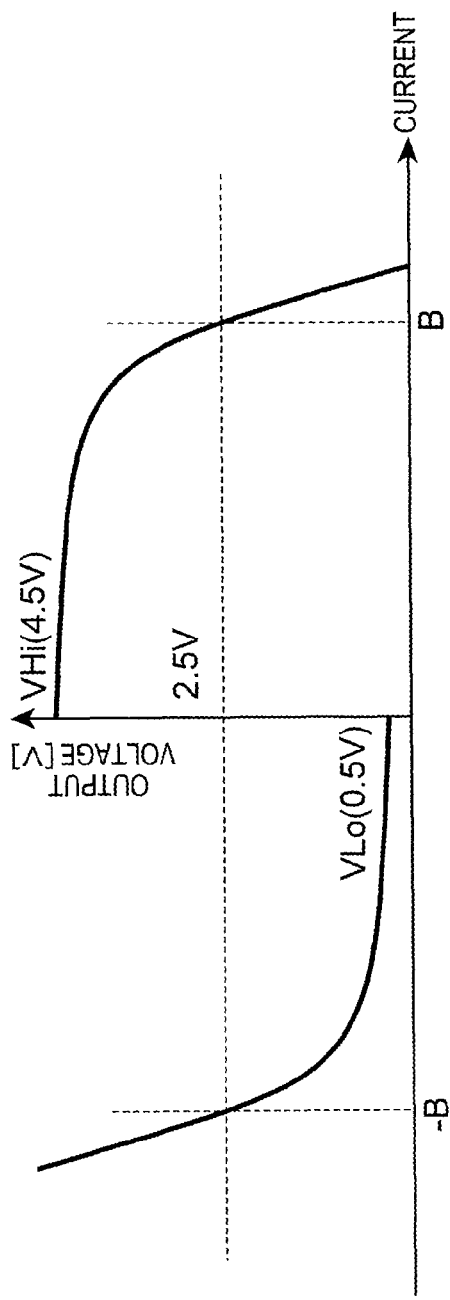

FIGS. 8A and 8B are graphs illustrating the characteristics of the high-side transistor (npn bipolar transistor) and the low-side transistor (pnp bipolar transistor). FIG. 8A illustrates the characteristics of the embodiment, and FIG. 8B illustrates the characteristics independent of the embodiment.

In FIGS. 8A and 8B, when the power supply voltage is set to 5 V, the GND voltage is set to 0 V, at a base voltage, the vertical axis represents the voltage (output voltage) of the emitter (the connection terminal 50a) of the push-pull circuit, the right horizontal axis represents the collector-to-emitter current of the high-side transistor (npn bipolar transistor), and the left horizontal axis represents the collector-to-emitter current of the low-side transistor (pnp bipolar transistor). According to the configuration of the push-pull circuit illustrated in FIG. 7, the current of the low-side transistor (pnp bipolar transistor) is represented as a negative (−) value.

As illustrated in FIG. 8A, in the embodiment, current-voltage characteristics of the high-side transistor (npn bipolar transistor) and the low-side transistor (pnp bipolar transistor) of the push-pull circuit are set to be different from each other. As illustrated in FIG. 8A, the current of the low-side transistor (pnp bipolar transistor) is higher than that of the high-side transistor (npn bipolar transistor). That is, the current-voltage characteristics of the high-side transistor (npn bipolar transistor) and the low-side transistor (pnp bipolar transistor) of the push-pull circuit are asymmetrical to each other. That is, the characteristics are not the same.

Since the same amount of current flows through the high-side transistor (npn bipolar transistor) and the low-side transistor (pnp bipolar transistor), the push-pull circuit outputs a voltage (1.0 V in FIG. 8A) at which an absolute value of the current ("A") of the npn bipolar transistor becomes equal to that of the current ("−A") of the pnp bipolar transistor. That is, the output voltage is set in a state where the output voltage is shifted toward a high current value.

When the base current is decreased, the current-voltage characteristics are shifted in such a way that the current of each of the high-side transistor (npn bipolar transistor) and the low-side transistor (pnp bipolar transistor) is decreased.

When the first voltage amplifier 43 outputs the power supply voltage, or a voltage close to the power supply voltage, in the first amplifier circuit 45, the high-side transistor (npn bipolar transistor) is turned off, and the low-side transistor (pnp bipolar transistor) is turned on. The output voltage (the voltage of the connection terminal 50a) becomes the lowest voltage of 0.5V (hereinafter, denoted as a minimum voltage VLo).

In contrast, when the first voltage amplifier 43 outputs the GND voltage, or a voltage close to the GND voltage, in the first amplifier circuit 45, the high-side transistor (npn bipolar transistor) is turned on, and the low-side transistor (pnp bipolar transistor) is turned off. The output voltage (the voltage of the connection terminal 50*a*) becomes the highest voltage of 4.5V (hereinafter, denoted as a maximum voltage VHi).

That is, the high-side transistor (npn bipolar transistor) and the low-side transistor (pnp bipolar transistor) are configured such that high-side transistor (npn bipolar transistor) and the low-side transistor (pnp bipolar transistor) operate reversely to each other (operate in a push-pull relationship), and the current-voltage characteristic of each of high-side transistor (npn bipolar transistor) and the low-side transistor (pnp bipolar transistor) changes depending on a voltage (base current) output from the first voltage amplifier 43. The output voltage becomes a voltage at which an absolute value of the current of the high-side transistor (npn bipolar transistor) becomes equal to that of the low-side transistor (pnp bipolar transistor).

The second amplifier circuit 46 operates similarly to the first amplifier circuit 45.

FIG. 8B illustrates a case in which the current-voltage characteristic of the high-side transistor (npn bipolar transistor) is symmetrical to that of the low-side transistor (pnp bipolar transistor). In this case, the characteristics are the same.

This case will be described later.

Figure 9:
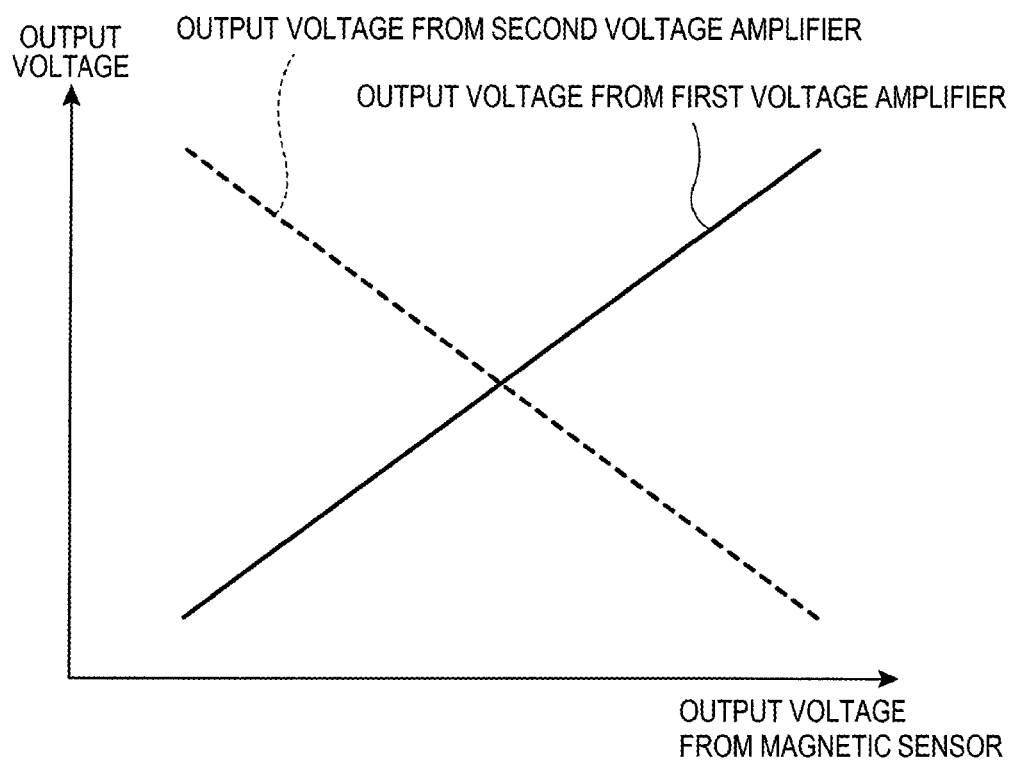
FIG. 9 is a graph illustrating output voltages from a first voltage amplifier and a second voltage amplifier.

FIG. 9 is a graph illustrating output voltages from the first voltage amplifier 43 and the second voltage amplifier 44.

The first voltage amplifier 43 and the second voltage amplifier 44 are well-known voltage amplifier circuits, and output voltage signals which are contradictory to each other. That is, a voltage output from the first voltage amplifier 43 is increased when an output voltage from the first magnetic sensor 41 is increased, and in contrast, a voltage output from the second voltage amplifier 44 is decreased when an output voltage from the second magnetic sensor 42 is increased.

Figure 10:
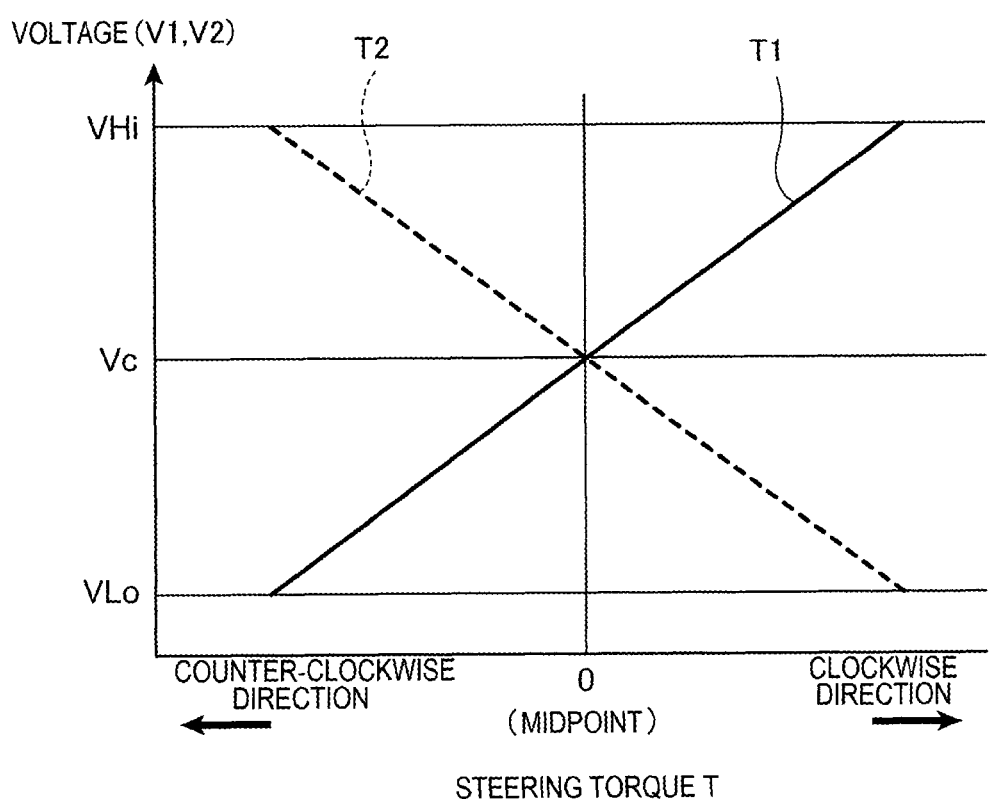
FIG. 10 is a graph illustrating a relationship between a first voltage signal output from a first amplifier circuit of the sensor unit, a second voltage signal output from a second amplifier circuit of the sensor unit, and steering torque T.

FIG. 10 is a graph illustrating a relationship between a first voltage signal T1 output from the first amplifier circuit 45 of the sensor unit 50, a second voltage signal T2 output from the second amplifier circuit 46 of the sensor unit 50, and the steering torque T.

In FIG. 10, the horizontal axis represents the steering torque T, and the vertical axis represents a first voltage V1 of the first voltage signal T1, and a second voltage V2 of the second voltage signal T2. A midpoint of the horizontal axis is defined as when the steering torque T is zero, in other words, when the amount of twisting of the torsion bar 140 is zero, the steering torque T in the clockwise direction is defined as being positive, and the steering torque T in a counter-clockwise direction is defined as being negative.

As illustrated in FIG. 10, the sensor unit 50 with the aforementioned configuration outputs the first voltage V1 and the second voltage V2 between the maximum voltage VHi and the minimum voltage VLo, with the first voltage signal T1 being representative of the first voltage V1 and the second voltage signal T2 being representative of the second voltage V2.

As illustrated by the solid line in FIG. 10, the first voltage signal T1 has a characteristic such that the voltage is increased when the steering torque T is increased in the clockwise direction (when the amount of clockwise rotation of the torsion bar 140 is increased). That is, when the steering wheel is turned in the clockwise direction, the first voltage V1 of the first voltage signal T1 is increased. In contrast, as illustrated by the dotted line in FIG. 10, the second voltage V2 of the second voltage signal T2 has an output characteristic which is contradictory to (opposite output characteristic or negative correlation) that of the first voltage signal T1, and has a characteristic such that the voltage is decreased when the steering torque T is increased in the clockwise direction. That is, when the steering wheel is turned in the clockwise direction, the second voltage V2 of the second voltage signal T2 is decreased.

The sensor unit 50 is configured such that the first voltage V1 of the first voltage signal T1 and the second voltage V2 of the second voltage signal T2 have the same voltage (hereinafter, which may be referred to as a "midpoint voltage Vc") at the midpoint. For example, the midpoint voltage Vc is a median voltage (Vc=(VHi+VLo)/2) between the maximum voltage VHi and the minimum voltage VLo.

A ratio (absolute value) of a change in the first voltage signal T1 to a change in the steering torque T is equal to a ratio (absolute value) of a change in the second voltage signal T2 to a change in the steering torque T, and a total voltage, which is the sum (aggregation) of the first voltage V1 of the first voltage signal T1 and the second voltage V2 of the second voltage signal T2, always becomes a predetermined voltage (2Vc), with the first voltage V1 and the second voltage V2 being representative of the same steering torque T.

Hereinafter, the ECU 10 will be described in detail.

Figure 11:
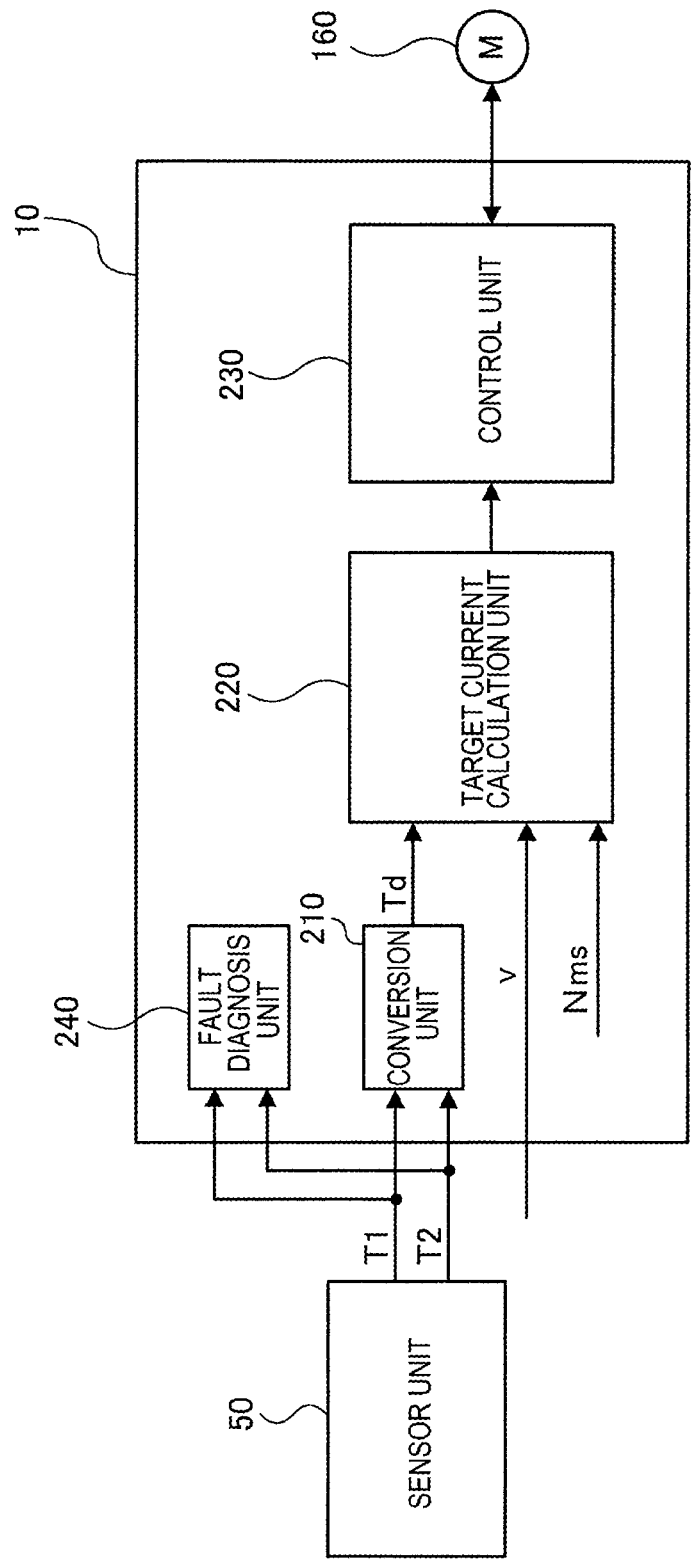
FIG. 11 is a block diagram illustrating the schematic configuration of an ECU of the steering apparatus.

FIG. 11 is a block diagram illustrating the schematic configuration of the ECU 10 of the steering apparatus 100.

The ECU 10 receives an output signal from the torque detection device 20; a vehicle speed signal v into which a vehicle speed detected by a vehicle speed sensor (not illustrated) is converted as an output signal; a rotation speed signal Nms into which the rotation speed of the electric motor 160 is converted as an output signal.

The ECU 10 has a conversion unit 210 that converts the output signal of the torque detection device 20 into a torque signal Td; a target current calculation unit 220 that calculates a target assist torque based on the torque signal Td from the conversion unit 210, and calculates target current which is required by the electric motor 160 so as to supply the target assist torque; and a control unit 230 that performs feedback control based on the target current calculated by the target current calculation unit 220.

The ECU 10 includes the fault diagnosis unit 240 as the abnormality detection unit for diagnosing whether a fault occurs in the torque detection device 20 based on an output signal from the torque detection device 20. The fault diagnosis unit 240 will be described in detail later.

When it is determined that a fault does not occur in the torque detection device 20, based on the first voltage signal T1 and the second voltage signal T2 which are respectively examples of a first signal and a second signal output from the torque detection device 20, the conversion unit 210 converts the first voltage signal T1 into the torque signal Td which is a digital signal which corresponds to the steering torque T, and outputs the converted torque signal Td to the target current calculation unit 220.

The target current calculation unit 220 includes a base current calculation unit (not illustrated) that calculates base current which is a reference used to set the target current; an inertia compensation current calculation unit (not illustrated) that calculates current required to counteract the moment of inertia of the electric motor 160; and a damper compensation current calculation unit (not illustrated) that calculates current for restricting the rotation of the motor. The target current calculation unit 220 includes a target current determination unit (not illustrated) that determines the target current based on outputs from the base current calculation unit, the inertia compensation current calculation unit, the damper compensation current calculation unit, and the like, and a phase compensation unit (not illustrated) that compensates for the phase of the torque signal Td. The target current calculation unit 220 calculates the target assist torque based on the torque signal Td output from the conversion unit 210, and calculates the target current which is required by the electric motor 160 so as to supply the target assist torque.

The control unit 230 has a motor drive control unit (not illustrated) that controls the operation of the electric motor 160; a motor drive unit (not illustrated) that drives the electric motor 160; and a motor current detection unit (not illustrated) that detects an actual current Im (not illustrated) which actually flows to the electric motor 160.

The motor drive control unit has a feedback (F/B) control unit (not illustrated) that performs feedback control based on a deviation between the target current which is finally determined by the target current calculation unit 220, and the actual current Im which is supplied to the electric motor 160 and is detected by the motor current detection unit, and a PWM signal generation unit (not illustrated) that generates a pulse-width modulation (PWM) signal used to drive the electric motor 160 using PWM.

The motor drive unit includes six independent transistors (FETs) (not illustrated) as switching elements, and switches two transistors selected from the six transistors by driving the gates of the two transistors such that the driving of the electric motor 160 is controlled.

The motor current detection unit detects a value of the actual current Im flowing to the electric motor 160, based on a voltage occurring between both ends of a shunt resistor (not illustrated) connected to the motor drive unit, converts the detected actual current Im into a motor current signal Ims (not illustrated), and outputs the motor current signal Ims.

The conversion unit 210, the target current calculation unit 220, the control unit 230, and the fault diagnosis unit 240 of the ECU 10 are mounted on an ECU substrate 11 (refer to FIGS. 2 and 3) on which electronic components are mounted. The ECU substrate 11 includes a control substrate 12 (refer to FIG. 2) on which a micro-computer and the peripheral equipment of the micro-computer, which form the conversion unit 210, the fault diagnosis unit 240, the target current calculation unit 220, the motor drive control unit, the motor current detection unit, and the like, are mounted, and a power substrate 13 (refer to FIG. 2) on which transistors and the like, which form the motor drive unit and controls the driving of the electric motor 160, are mounted. Insertion holes 12a (refer to FIG. 2) are formed in the control substrate 12, and the signal lines 52, which are connection lines to the sensor unit 50 of the torque detection device 20, are inserted into the insertion holes 12a. Motor terminals 18 are attached to the power substrate 13, are inserted into the electric motor 160, and are electrically connected to the winding terminals (not illustrated) of the electric motor 160.

The ECU 10 includes a frame 14 (refer to FIG. 2) for attaching the control substrate 12 to the first member 111 of the gear box 110, and the cover 15 (refer to FIG. 1) that covers the control substrate 12; the power substrate 13; the frame 14; and the like.

The frame 14 made of insulating resin is insert-molded, has a wiring pattern which is formed of multiple conductive wires, and is electrically connected to the control substrate 12 and the power substrate 13. A connection connector 16 is attached to the frame 14, and connects the ECU 10 to a network (CAN) or the like of each of a battery and various pieces of equipment mounted in a conveyance apparatus such as a vehicle (refer to FIGS. 1 and 2).

Hereinafter, the fault diagnosis unit 240 will be described.

Figure 12:
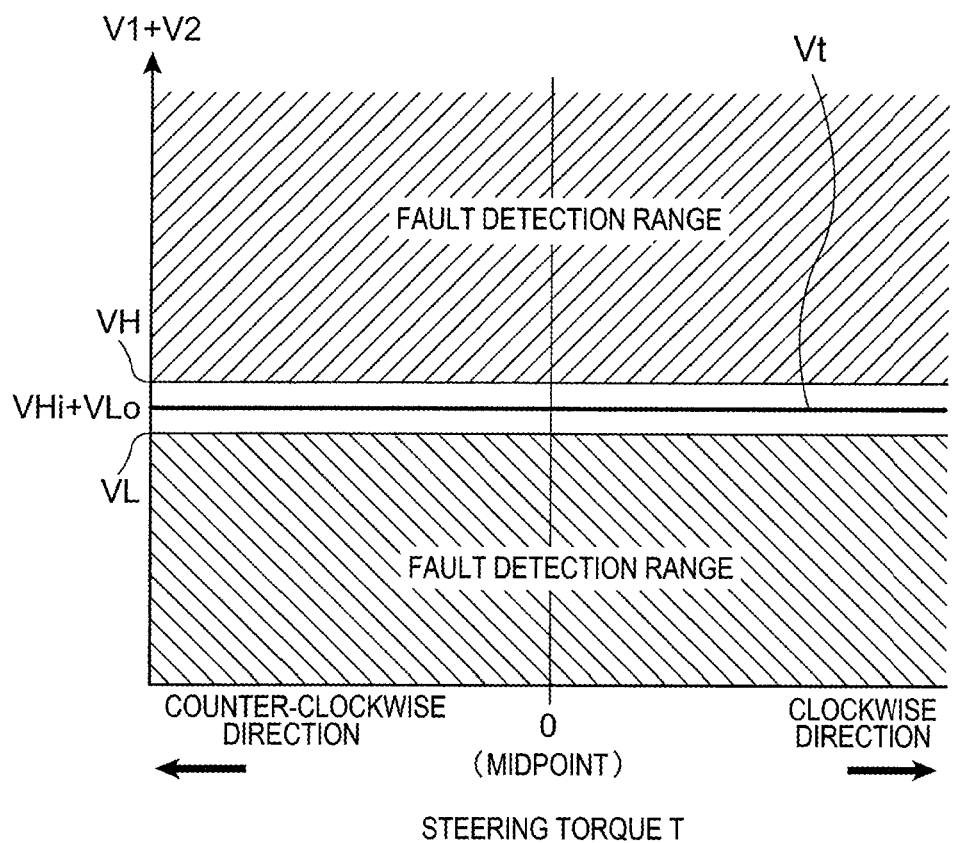
FIG. 12 is a graph illustrating a fault detection range of the torque detection device.

FIG. 12 is a graph illustrating a fault detection range of the torque detection device 20.

When a stuck fault occurs in the circuits of the sensor unit 50 and the like, the first voltage V1 of the first voltage signal T1 or the second voltage V2 of the second voltage signal T2 is stuck to an output upper limit value or an output lower limit value. Examples of a signal abnormality fault occurring in the sensor unit 50 include a fault in which the first voltage V1 of the first voltage signal T1 changes to a voltage greater than a normal value; a fault in which the first voltage V1 of the first voltage signal T1 changes to a voltage less than the normal value; a fault in which the second voltage V2 of the second voltage signal T2 changes to a voltage greater than a normal value; and a fault in which the second voltage V2 of the second voltage signal T2 changes to a voltage less than the normal value.

When the torque detection device 20 operates normally, a total voltage Vt, which is the sum of the first voltage V1 of the first voltage signal T1 and the second voltage V2 of the second voltage signal T2, always becomes a predetermined voltage (VHi+VLo) (refer to the solid line in FIG. 12).

In contrast, when a stuck fault occurs in the circuits of the sensor unit 50, and thus the first voltage V1 of the first voltage signal T1 or the second voltage V2 of the second voltage signal T2 is stuck to the output upper limit value, or when a signal abnormality fault occurs, and thus the first voltage V1 or the second voltage V2 changes to a voltage greater than the normal value, the total voltage Vt is increased to a voltage which is higher than the predetermined voltage. In contrast, when a stuck fault occurs in the circuits of the sensor unit 50, and thus the first voltage V1 or the second voltage V2 is stuck to the output lower limit value, or when a signal abnormality fault occurs, and thus the first voltage V1 or the second voltage V2 changes to a voltage less the normal value, the total voltage Vt is decreased to a voltage which is lower than the predetermined voltage.

Hence, when the total voltage Vt, which is the sum of the first voltage V1 of the first voltage signal T1 and the second voltage V2 of the second voltage signal T2, has a value different from the predetermined voltage (VHi+VLo), it is possible to determine that a fault occurs in the torque detection device 20. Variations in the total voltage Vt induced by errors, pulsation, or the like of the sensor unit 50 are taken into consideration, and as illustrated in FIG. 12, the fault detection range is defined as a region above an upper limit reference value VH which is greater than the predetermined voltage (VHi+VLo), and a region below a lower limit reference value VL which is less than the predetermined voltage (VHi+VLo). When the total voltage Vt is in the fault detection range, the fault diagnosis unit 240 determines that a fault occurs in the torque detection device 20.

In this way, the fault diagnosis unit 240 determines the occurrence of a fault in the torque detection device 20 based on the first voltage V1 of the first voltage signal T1 and the second voltage V2 of the second voltage signal T2. When the fault diagnosis unit 240 determines that a fault occurs in the torque detection device 20, the fault diagnosis unit 240 outputs a signal indicative of the occurrence of a fault to the target current calculation unit 220. When the target current calculation unit 220 acquires the signal indicating that a fault occurs in the torque detection device 20, the target current calculation unit 220 sets the target current, to be supplied to the electric motor 160, to zero. When the fault diagnosis unit 240 determines that a fault occurs in the torque detection device 20, the fault diagnosis unit 240 may turn on a vehicle's warning lamp (WLP) configured to notify a user that a fault occurs in the torque detection device 20.

In the steering apparatus 100 according to the embodiment, since the sensor unit 50 has the configuration illustrated in FIG. 7, even if an upstream portion of the first amplifier circuit 45 is short-circuited to an upstream portion of the second amplifier circuit 46, or a downstream portion of the first amplifier circuit 45 is short-circuited to a downstream portion of the second amplifier circuit 46, the fault diagnosis unit 240 can determine the occurrence of a fault in the torque detection device 20 based on the first voltage signal T1 and the second voltage signal T2.

As an example of when the downstream portion of the first amplifier circuit 45 is short-circuited to the downstream portion of the second amplifier circuit 46, it is assumed that the signal line 52a is short-circuited to the signal line 52b.

Figure 13A:
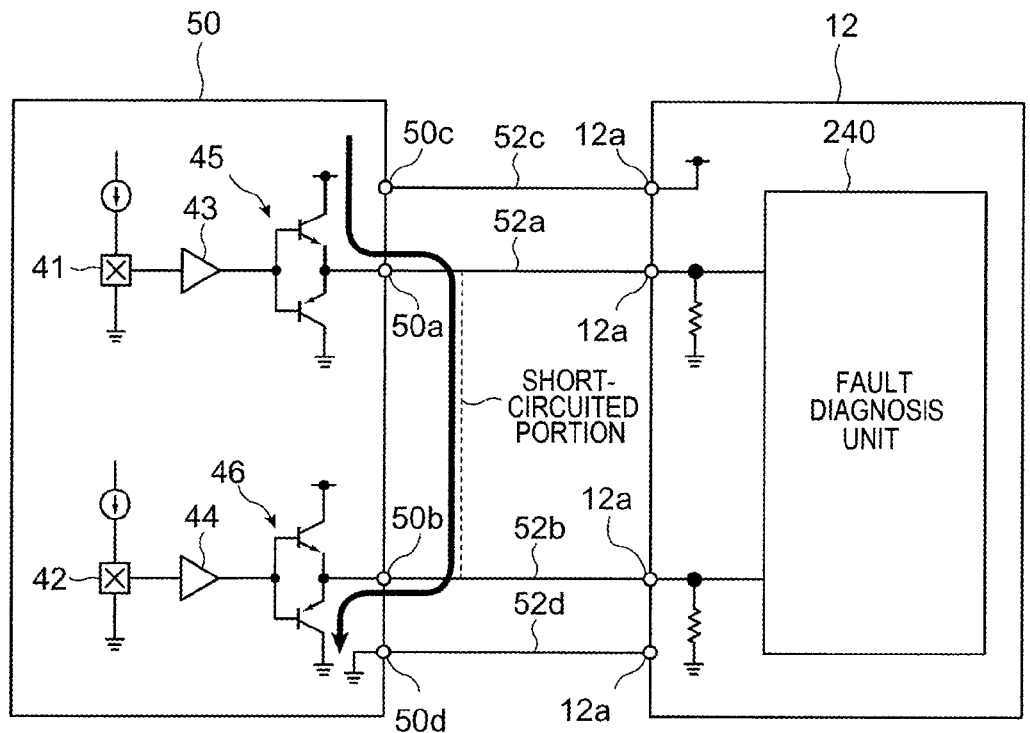
FIGS. 13A and 13B are circuit diagrams illustrating a flow of current when signal lines are short-circuited together.
Figure 13B:
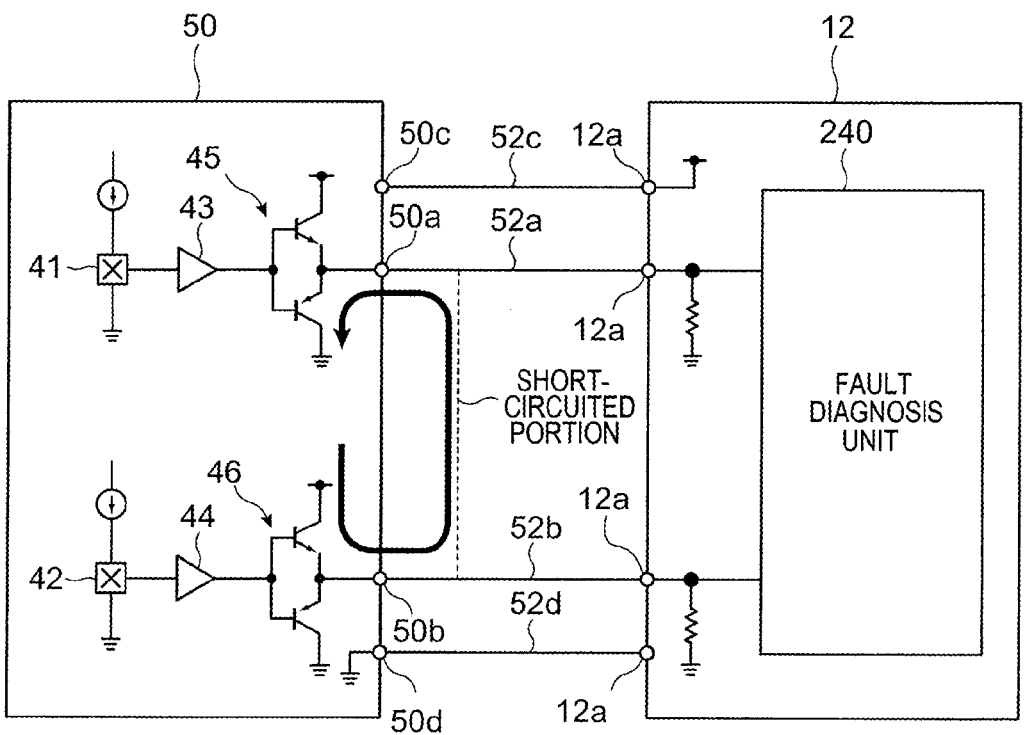

FIGS. 13A and 13B are circuit diagrams illustrating a flow of current when the signal line 52a is short-circuited to the signal line 52b. FIG. 13A illustrates a flow of current when the steering torque T is positive, and FIG. 13B illustrates a flow of current when the steering torque T is negative.

As illustrated in FIG. 13A, when the steering torque T is positive, the high-side transistor (npn bipolar transistor) of the first amplifier circuit 45 operates, and the low-side transistor (pnp bipolar transistor) of the second amplifier circuit 46 operates.

As illustrated in FIG. 13B, when the steering torque T is negative, the high-side transistor (npn bipolar transistor) of the second amplifier circuit 46 operates, and the low-side transistor (pnp bipolar transistor) of the second amplifier circuit 45 operates.

In both cases, current flows through the high-side transistor (npn bipolar transistor) and the low-side transistor (pnp bipolar transistor). That is, the source current flows through the high-side transistor (npn bipolar transistor), and the sink current flows through the low-side transistor (pnp bipolar transistor).

This state is equivalent to a state in which either of the first amplifier circuit 45 and the second amplifier circuit 46 operates.

As illustrated in FIG. 8A, when the current-voltage characteristics of the high-side transistor (npn bipolar transistor) and the low-side transistor (pnp bipolar transistor) are different from each other, currents with the same absolute values as illustrated by "A" and "−A" flow therethrough. In the case illustrated in FIG. 8A, an output voltage is 1.0V.

Figure 14A:
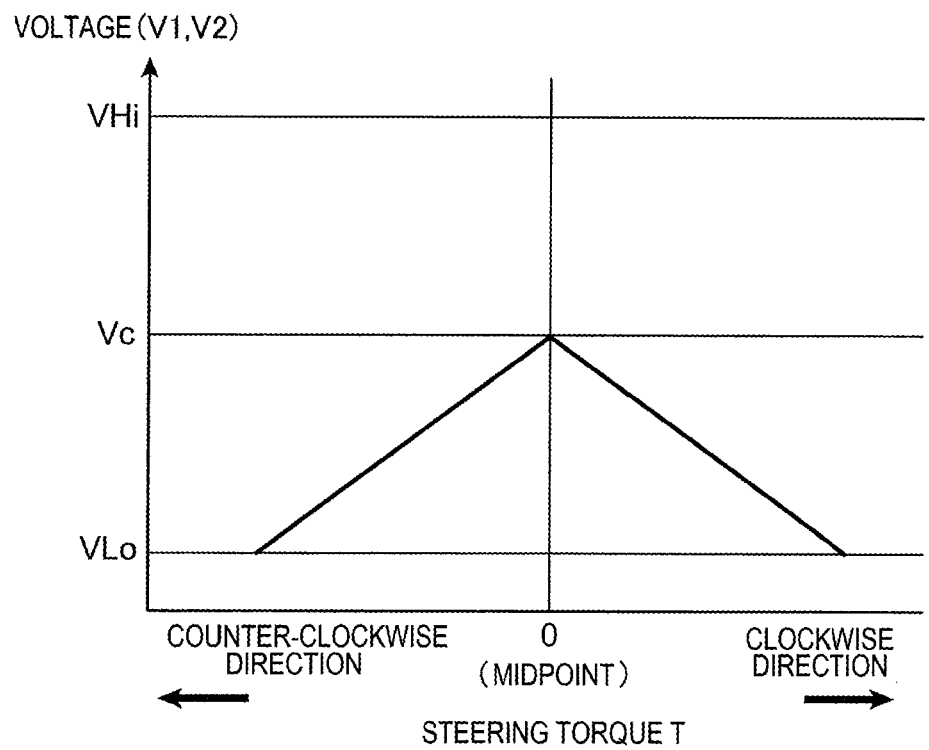
FIG. 14A is a graph illustrating a first voltage of the first voltage signal output from the first amplifier circuit, and a second voltage of the second voltage signal output from the second amplifier circuit when the signal lines are short-circuited together.
Figure 14B:
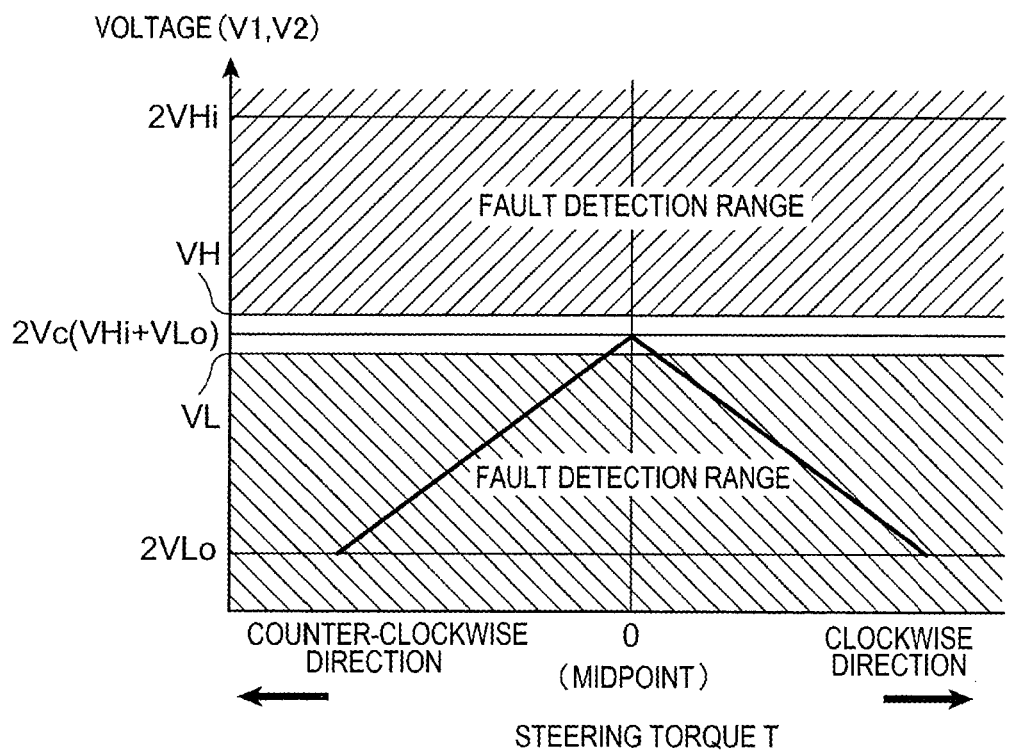
FIG. 14B is a graph illustrating a total voltage, which is the sum of the first voltage and the second voltage, when the signal lines are short-circuited together.

FIG. 14A is a graph illustrating the first voltage V1 of the first voltage signal T1 output from the first amplifier circuit 45, and the second voltage V2 of the second voltage signal T2 output from the second amplifier circuit 46 when the signal line 52a is short-circuited to the signal line 52b. FIG. 14B is a graph illustrating the total voltage Vt, which is the sum of the first voltage V1 and the second voltage V2 when the signal line 52a is short-circuited to the signal line 52b.

When the steering torque T is positive, current flows through the high-side transistor (npn bipolar transistor) of the first amplifier circuit 45, a short-circuited portion, and the low-side transistor (pnp bipolar transistor) of the second amplifier circuit 46. Consequently, as illustrated in FIG. 14A, the first voltage V1 of the first voltage signal T1 output from the first amplifier circuit 45 becomes equal to the second voltage V2 of the second voltage signal T2 output from the second amplifier circuit 46, and in a normal state, a voltage becomes equal to the second voltage V2 of the second voltage signal T2 output from the second amplifier circuit 46 (refer to a case in which the steering torque T is applied in the clockwise direction in FIG. 10).

In contrast, when the steering torque T is negative, current flows through the high-side transistor (npn bipolar transistor) of the second amplifier circuit 46, a short-circuited portion, and the low-side transistor (pnp bipolar transistor) of the first amplifier circuit 45. Consequently, as illustrated in FIG. 14A, the first voltage V1 of the first voltage signal T1 output from the first amplifier circuit 45 becomes equal to the second voltage V2 of the second voltage signal T2 output from the second amplifier circuit 46, and in a normal state, a voltage becomes equal to the first voltage V1 of the first voltage signal T1 output from the first amplifier circuit 45 (refer to a case in which the steering torque T is applied in the counter-clockwise direction in FIG. 10).

Hence, when the signal line 52a is short-circuited to the signal line 52b, as illustrated in FIG. 14B, the total voltage Vt of the first voltage V1 of the first voltage signal T1 output from the first amplifier circuit 45, and the second voltage V2 of the second voltage signal T2 output from the second amplifier circuit 46 has a value which is two times the first voltage V1 or the second voltage V2. In this case, since the total voltage Vt is in the fault detection range, the fault diagnosis unit 240 determines that a fault occurs in the torque detection device 20.

In the steering apparatus 100 according to the embodiment, even if a short circuit occurs in the sensor unit 50, or a short circuit between the signal lines 52 occurs, the fault diagnosis unit 240 can determine that the occurrence of a fault in the torque detection device 20 based on the first voltage signal T1 and the second voltage signal T2.

In the sensor unit 50 according to the embodiment illustrated in FIG. 7, the first magnetic sensor 41 outputs a signal which corresponds to a relative rotation angle between the first rotation shaft 120 and the second rotation shaft 130. The first voltage amplifier 43 amplifies the signal output from the first magnetic sensor 41.

In parallel, the second magnetic sensor 42 outputs a signal which corresponds to the relative rotation angle. The second voltage amplifier 44 amplifies the signal output from the second magnetic sensor 42. At this time, the signal (second sensor signal) output from the second voltage amplifier 44 has a characteristic which is contradictory to that of the signal (first sensor signal) output from the first voltage amplifier 43.

The signal (first sensor signal) output from the first voltage amplifier 43 is input to and is amplified by the first voltage amplifier 45, and as a result, the first voltage signal T1 is generated. Similarly, the signal (second sensor signal) output from the second voltage amplifier 44 is input to and is amplified by the second voltage amplifier 46, and as a result, the second voltage signal T2 is generated.

The fault diagnosis unit 240 detects abnormality of the first voltage signal T1 or the second voltage signal T2 based on the input first voltage signal T1 or the input second voltage signal T2. That is, in the embodiment, a fault of a fault detection target is detected based on multiple signals such as the first sensor signal and the second sensor signal, the characteristics of which are contradictory to each other.

In contrast, as illustrated in FIG. 8B, when the high-side transistor (npn bipolar transistor) and the low-side transistor (pnp bipolar transistor) have the same current-voltage characteristics, an output voltage, at which the currents have the same value, becomes a median value Vc (for example, 2.5 V) illustrated by "B" and "−B". This value is not dependent on an output of the first voltage amplifier 43 and/or an output of the second voltage amplifier 44. That is, the first voltage V1 and the second voltage V2 is stuck to the median value Vc regardless of steering torque T.

For this reason, similar to the normal state, the total voltage Vt of the first voltage V1 of the first voltage signal T1 output from the first amplifier circuit 45, and the second voltage V2 of the second voltage signal T2 output from the second amplifier circuit 46 becomes a value of 2Vc which is two times the first voltage V1 or the second voltage V2. That is, it is not possible to detect a short-circuit fault between the signal line 52a and the signal line 52b.

In the sensor unit 50 according to the embodiment, the current-voltage characteristics of the high-side transistor (npn bipolar transistor) and the low-side transistor (pnp bipolar transistor), which are assembled in each of the first amplifier circuit 45 and the second amplifier circuit 46, are asymmetrical to each other. That is, the characteristics are not the same.

It is possible to detect a short-circuit fault by adopting a configuration in which a resistor is disposed on the signal line through which an output signal is transmitted from the magnetic sensor 40; however, the impedance of the signal line, through which an output signal is transmitted from the magnetic sensor 40, is increased, and the signal line is likely to be susceptible to noise. In contrast, in the sensor unit 50 according to the embodiment, since a resistor is not disposed on the signal line, through which an output signal is transmitted from the magnetic sensor 40, the impedance of the signal line, through which an output signal is transmitted from the magnetic sensor 40, is not increased, and the signal line is unlikely to be susceptible to noise.

It is possible to detect a short-circuit fault by adopting a configuration in which a resistor is provided between the high-side transistor (npn bipolar transistor) and the power supply terminal 50c, or a configuration in which a resistor is provided between the low-side transistor (pnp bipolar transistor) and the GND terminal 50d in each of the first amplifier circuit 45 and the second amplifier circuit 46; however, the amplitude of an output signal from each of the first amplifier circuit 45 and the second amplifier circuit 46 is decreased due to the resistor being provided. That is, an operation margin becomes narrow. In contrast, in the sensor unit 50 according to the embodiment, a resistor is not provided between the high-side transistor (npn bipolar transistor) and the power supply terminal 50c, and between the low-side transistor (pnp bipolar transistor) and the GND terminal 50d. For this reason, the amplitude of an output signal from each of the first amplifier circuit 45 and the second amplifier circuit 46 can be prevented from being decreased, that is, an operation margin can be prevented from becoming narrow.

In addition, in the embodiment, it is not necessary to add resistors to the sensor unit 50, and thus it is possible to reduce costs.

Figure 15:
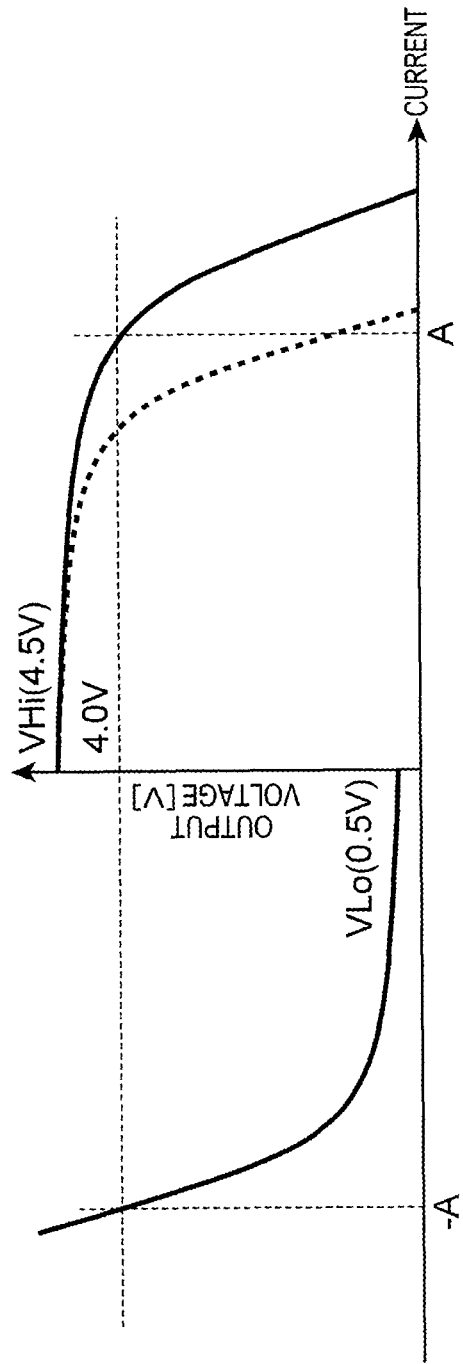
FIG. 15 is a graph illustrating other characteristics (modification example) of the high-side transistor (npn bipolar transistor) and the low-side transistor (pnp bipolar transistor).

FIG. 15 is a graph illustrating other characteristics (modification example) of the high-side transistor (npn bipolar transistor) and the low-side transistor (pnp bipolar transistor).

The current-voltage characteristics of the high-side transistor (npn bipolar transistor) and the low-side transistor (pnp bipolar transistor) are opposite to those in the case illustrated in FIGS. 8A and 8B, and at a base voltage, the current of the high-side transistor (npn bipolar transistor) is higher than that of the low-side transistor (pnp bipolar transistor).

Since other aspects are the same as those in the case illustrated in FIGS. 8A and 8B, hereinafter, only the point of differences will be described.

Also in the steering apparatus 100 having the sensor unit 50 with the aforementioned configuration, even if the upstream portion of the first amplifier circuit 45 is short-circuited to the upstream portion of the second amplifier circuit 46, or the downstream portion of the first amplifier circuit 45 is short-circuited to the downstream portion of the second amplifier circuit 46, the fault diagnosis unit 240 can determine the occurrence of a fault in the torque detection device 20 based on the first voltage signal T1 and the second voltage signal T2. A state of the short-circuit fault in this case is equivalent to that illustrated in each of FIGS. 13A and 13B.

Figure 16A:
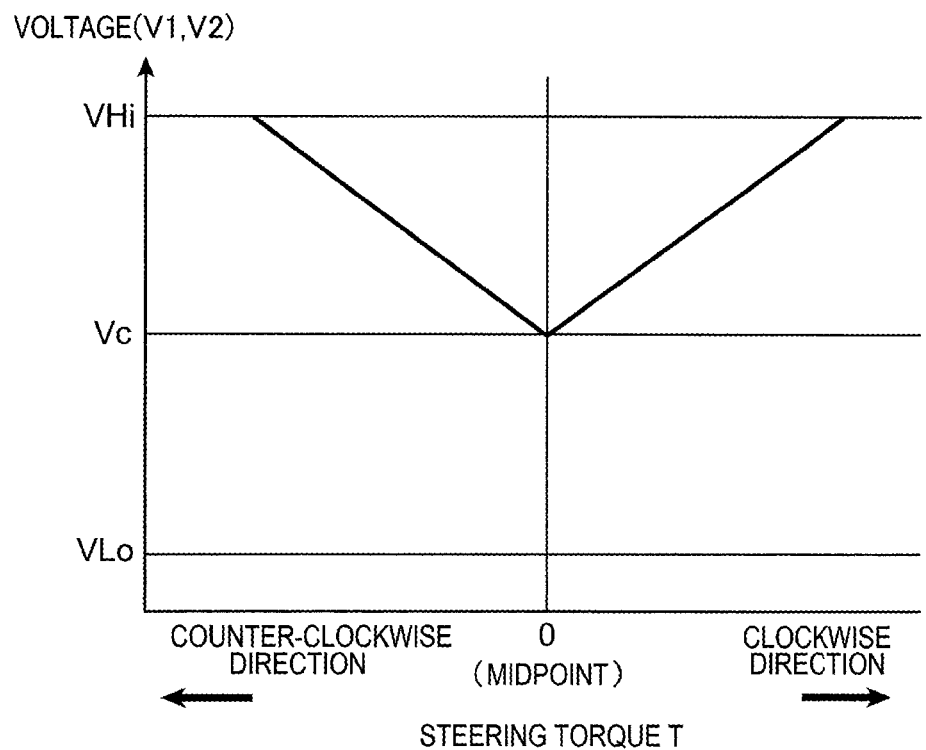
FIG. 16A is a graph illustrating the first voltage of the first voltage signal output from the first amplifier circuit, and the second voltage of the second voltage signal output from the second amplifier circuit when signal lines are short-circuited together.
Figure 16B:
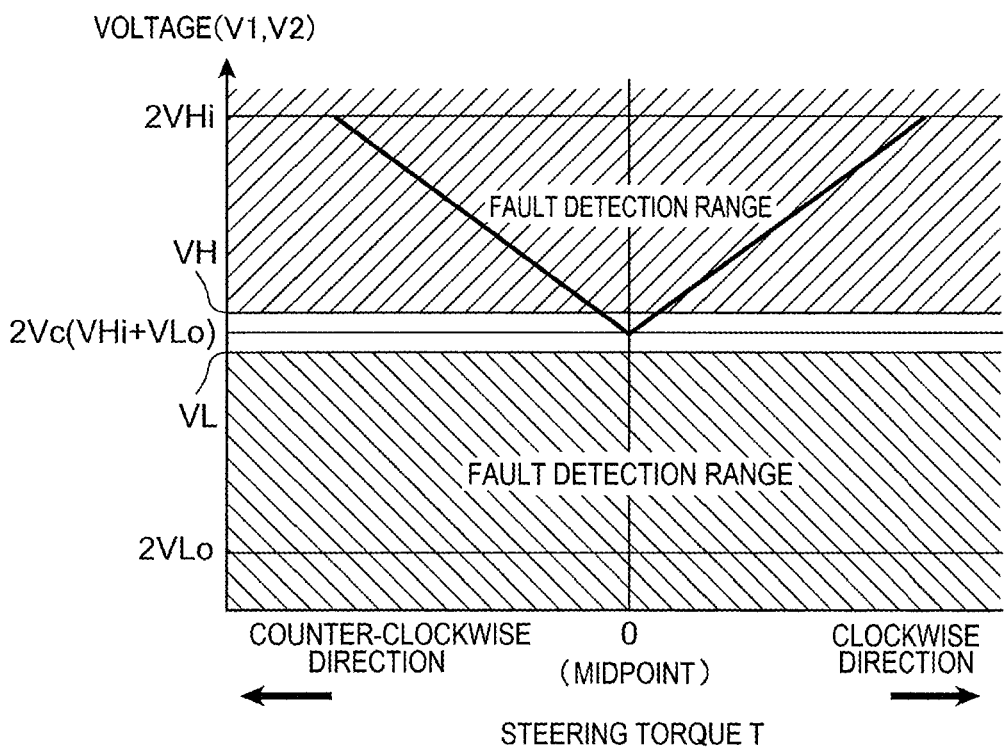
FIG. 16B is a graph illustrating a total voltage, which is the sum of the first voltage and the second voltage, when the signal lines are short-circuited together.

FIG. 16A is a graph illustrating the first voltage V1 of the first voltage signal T1 output from the first amplifier circuit 45, and the second voltage V2 of the second voltage signal T2 output from the second amplifier circuit 46 when the signal line 52a is short-circuited to the signal line 52b. FIG. 16B is a graph illustrating the total voltage Vt, which is the sum of the first voltage V1 and the second voltage V2, when the signal line 52a is short-circuited to the signal line 52b.

When the steering torque T is positive, current flows through the high-side transistor (npn bipolar transistor) of the first amplifier circuit 45, a short-circuited portion, and the low-side transistor (pnp bipolar transistor) of the second amplifier circuit 46. Consequently, as illustrated in FIG. 16A, the first voltage V1 of the first voltage signal T1 output from the first amplifier circuit 45 becomes equal to the second voltage V2 of the second voltage signal T2 output from the second amplifier circuit 46, and in a normal state, a voltage becomes equal to the first voltage V1 of the first voltage signal T1 output from the first amplifier circuit 45 (refer to the case in which the steering torque T is applied in the clockwise direction in FIG. 10).

In contrast, when the steering torque T is negative, current flows through the high-side transistor (npn bipolar transistor) of the second amplifier circuit 46, a short-circuited portion, and the low-side transistor (pnp bipolar transistor) of the first amplifier circuit 45. Consequently, as illustrated in FIG. 16A, the first voltage V1 of the first voltage signal T1 output from the first amplifier circuit 45 becomes equal to the second voltage V2 of the second voltage signal T2 output from the second amplifier circuit 46, and in a normal state, a voltage becomes equal to the second voltage V2 of the second voltage signal T2 output from the second amplifier circuit 46 (refer to the case in which the steering torque T is applied in the counter-clockwise direction in FIG. 10).

Hence, when the signal line 52a is short-circuited to the signal line 52b, as illustrated in FIG. 16B, the total voltage Vt of the first voltage V1 of the first voltage signal T1 output from the first amplifier circuit 45, and the second voltage V2 of the second voltage signal T2 output from the second amplifier circuit 46 has a value which is two times the first voltage V1 or the second voltage V2. In this case, since the total voltage Vt is in the fault detection range, the fault diagnosis unit 240 determines that a fault occurs in the torque detection device 20.

In the steering apparatus 100 that includes the sensor unit 50 with the high-side transistors (npn bipolar transistors) and the low-side transistors (pnp bipolar transistors) having the current-voltage characteristic illustrated in FIG. 15, even if a short circuit occurs in the sensor unit 50, or a short circuit between the signal lines 52 occurs, the fault diagnosis unit 240 can determine that the occurrence of a fault in the torque detection device 20 based on the first voltage signal T1 and the second voltage signal T2.

In the description given above, the first amplifier circuit 45 and the second amplifier circuit 46 have the same characteristic. However, the first amplifier circuit 45 and the second amplifier circuit 46 may have different characteristics. That is, the asymmetry of the characteristic of the high-side transistor (npn bipolar transistor) and the low-side transistor (pnp bipolar transistor) in the first amplifier circuit 45 may be the same as that of the high-side transistor (npn bipolar transistor) and the low-side transistor (pnp bipolar transistor) in the second amplifier circuit 46. That is, when the current of the high-side transistor (npn bipolar transistor) is higher than that of the low-side transistor (pnp bipolar transistor) in the first amplifier circuit 45, the second amplifier circuit 46 may be configured to have the same relationship between the current of the high-side transistor (npn bipolar transistor) and the current of the low-side transistor (pnp bipolar transistor).

Each of the first amplifier circuit 45 and the second amplifier circuit 46 is configured as a combination (pair) of the npn bipolar transistor and pnp bipolar transistor. A field effect transistor may be used in replacement of a bipolar transistor. In this case, a p-type field effect transistor may be used in replacement of the npn bipolar transistor, and an n-type field effect transistor may be used in replacement of the pnp bipolar transistor.

The sensor unit 50 illustrated in FIG. 7 includes the first magnetic sensor 41 and the first voltage amplifier 43 as the first output unit for outputting a signal which corresponds to a relative rotation angle between the first rotation shaft 120 and the second rotation shaft 130, and the second magnetic sensor 42 and the second voltage amplifier 44 as the second output unit for outputting a signal that corresponds to the relative rotation angle and has a characteristic which is contradictory to that from the first output unit. The first magnetic sensor 41 and the second magnetic sensor 42 output voltage signals with the same value, and the first voltage amplifier 43 and the second voltage amplifier 44 output voltage signals which are contradictory to each other. However, the present invention is not limited to this characteristic in the embodiment. For example, even if magnetic flux density between the first yoke 31 and the second yoke 32 is the same, the first magnetic sensor 41 and the second magnetic sensor 42 may output voltage signals which are contradictory to each other, and the first voltage amplifier 43 and the second voltage amplifier 44 may be configured as the same voltage amplifier circuit.

In the description give above, the characteristic of a signal output from the first voltage amplifier 43 is contracting (inverted) to that of a signal output from the second voltage amplifier 44. These signals may have different amplitudes in replacement of the contradictory characteristics, or a neutral voltage may be offset. That is, the signal output from the first voltage amplifier 43 and the signal output from the second voltage amplifier 44 may have different characteristics, and abnormality of a fault detection target may be able to be detected based on the difference between the signals.

The sensor unit 50 illustrated in FIG. 7 may be configured as a combination of a Hall element as at least the first magnetic sensor 41; a Hall IC that includes the first voltage amplifier 43 and the first amplifier circuit 45; a Hall element as the second magnetic sensor 42; and a Hall IC that includes the second voltage amplifier 44 and the second amplifier circuit 46.

In the description given above, the sensor unit 50 is used as a torque sensor; however, since the sensor unit 50 does not require an additional member such as a resistor, the sensor unit 50 can be used to detect a short circuit or the like between signal lines in the interior of the apparatus, harnesses, connectors, and the like as fault detection targets.

What is claimed is:

1. A sensor fault detection circuit comprising:
a first amplifier circuit that comprises a first pair of elements operating reversely to each other, and amplifies a first sensor signal input from a fault detection target to output a first signal;
a second amplifier circuit that comprises a second pair of elements operating reversely to each other, and amplifies a second sensor signal which is input from the fault detection target and is different from the first sensor signal to output a second signal; and
an abnormality detection unit that detects abnormality of the first signal or the second signal based on the first signal output from the first amplifier circuit and the second signal output from the second amplifier circuit,
wherein characteristics of the first pair of elements of the first amplifier circuit are asymmetrical to each other, and characteristics of the second pair of elements of the second amplifier circuit are asymmetrical to each other in a same relationship with a relationship of the asymmetry between the characteristics of the first pair of elements.

2. The sensor fault detection circuit according to claim 1, wherein the first sensor signal and the second sensor signal obtained from the fault detection target are different from each other, and the abnormality detection unit detects abnormality of the fault detection target based on the difference between the first sensor signal and the second sensor signal.

3. A relative rotation angle detection device comprising:
a first output unit that outputs a signal which corresponds to a relative rotation angle between two rotation shafts which are coaxially disposed;
a first amplifier circuit that comprises a first pair of elements operating reversely to each other, and amplifies the output signal from the first output unit to output a first signal;
a second output unit that outputs a signal which corresponds to the relative rotation angle and which has a characteristic being contradictory to a characteristic of the signal output from the first output unit;
a second amplifier circuit that comprises a second pair of elements operating reversely to each other, and amplifies the output signal from the second output unit to output a second signal; and
an abnormality detection unit that detects abnormality of the first signal or the second signal based on the first signal output from the first amplifier circuit and the second signal output from the second amplifier circuit,
wherein characteristics of the first pair of elements of the first amplifier circuit are asymmetrical to each other, and characteristics of the second pair of elements of the second amplifier circuit are asymmetrical to each other in a same relationship with a relationship of the asymmetry between the characteristics of the first pair of elements.

4. The relative rotation angle detection device according to claim 3,
wherein each of the first amplifier circuit and the second amplifier circuit is a push-pull circuit.

5. The relative rotation angle detection device according to claim 3,
wherein when a value, obtained by adding a value of the first signal to a value of the second signal, is a value out of a predetermined range, the abnormality detection unit determines that abnormality of the first signal or the second signal occurs.

6. The relative rotation angle detection device according to claim 4,
wherein when a value, obtained by adding a value of the first signal to a value of the second signal, is a value out of a predetermined range, the abnormality detection unit determines that abnormality of the first signal or the second signal occurs.

7. The relative rotation angle detection device according to claim 3,
wherein each of the first output unit and the second output unit has a Hall element configured to output a voltage signal which corresponds to the relative rotation angle between the two rotation shafts, and a voltage amplifier circuit that amplifies the voltage signal output from the Hall element.

8. The relative rotation angle detection device according to claim 4,
wherein each of the first output unit and the second output unit has a Hall element configured to output a voltage signal which corresponds to the relative rotation angle between the two rotation shafts, and a voltage amplifier circuit that amplifies the voltage signal output from the Hall element.

9. The relative rotation angle detection device according to claim 5,
wherein each of the first output unit and the second output unit has a Hall element configured to output a voltage signal which corresponds to the relative rotation angle between the two rotation shafts, and a voltage amplifier circuit that amplifies the voltage signal output from the Hall element.

10. The relative rotation angle detection device according to claim 6,
wherein each of the first output unit and the second output unit has a Hall element configured to output a voltage signal which corresponds to the relative rotation angle between the two rotation shafts, and a voltage amplifier circuit that amplifies the voltage signal output from the Hall element.

11. A motor-driven power steering apparatus comprising:
a first output unit that outputs a signal which corresponds to a relative rotation angle between two rotation shafts which are coaxially disposed;
a first amplifier circuit that comprises a first pair of elements operating reversely to each other, and amplifies the output signal from the first output unit to output a first signal;
a second output unit that outputs a signal which corresponds to the relative rotation angle and which has a characteristic being contradictory to a characteristic of the signal output from the first output unit;
a second amplifier circuit that comprises a second pair of elements operating reversely to each other, and amplifies the output signal from the second output unit to output a second signal; and
an abnormality detection unit that detects abnormality of the first signal or the second signal based on the first signal output from the first amplifier circuit and the second signal output from the second amplifier circuit,
wherein characteristics of the first pair of elements of the first amplifier circuit are asymmetrical to each other, and characteristics of the second pair of elements of the second amplifier circuit are asymmetrical to each other in a same relationship with a relationship of the asymmetry between the characteristics of the first pair of elements.

* * * * *